US012777644B2

(12) United States Patent
Eom

(10) Patent No.: US 12,777,644 B2
(45) Date of Patent: Oct. 27, 2026

(54) MEMORY DEVICE INCLUDING INTERFACE BETWEEN CONDUCTIVE LAYERS

(71) Applicant: SK hynix Inc., Icheon-si (KR)

(72) Inventor: Dae Sung Eom, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 439 days.

(21) Appl. No.: 18/354,289

(22) Filed: Jul. 18, 2023

(65) Prior Publication Data

US 2024/0244842 A1 Jul. 18, 2024

(30) Foreign Application Priority Data

Jan. 13, 2023 (KR) ........................ 10-2023-0005521

(51) Int. Cl.

| | |
|---|---|
| ***H10B 43/27*** | (2023.01) |
| ***G11C 5/06*** | (2006.01) |
| ***H10B 43/10*** | (2023.01) |
| ***H10B 43/35*** | (2023.01) |

(52) U.S. Cl.

CPC ............. *H10B 43/27* (2023.02); *G11C 5/063* (2013.01); *H10B 43/10* (2023.02); *H10B 43/35* (2023.02)

(58) Field of Classification Search

CPC ........ H10B 53/00; H10B 53/10; H10B 53/20; H10B 53/30; H10B 53/40; H10B 53/50; H10B 41/00; H10B 41/10; H10B 41/20; H10B 41/23; H10B 41/27; H10B 41/30; H10B 41/35; H10B 41/40–44; H10B 41/46; H10B 41/50; H10B 41/60; H10B 41/70; H10B 43/00; H10B 43/10; H10B 43/20; H10B 43/23; H10B 43/27; H10B 43/30; H10B 43/35; H10B 43/40; H10B 43/50; H10B 51/00; H10B 51/10; H10B 51/20; H10B 51/30; H10B 51/40; H10B 51/50

See application file for complete search history.

(56) References Cited

U.S. PATENT DOCUMENTS

2012/0037977 A1* 2/2012 Lee ........................ H10B 43/20 257/E27.081
2014/0070300 A1* 3/2014 Jang ........................ H10B 43/27 257/324

FOREIGN PATENT DOCUMENTS

KR 1020140035084 A 3/2014
KR 1020140088424 A 7/2014
KR 1020220105878 A 7/2022

* cited by examiner

*Primary Examiner* — William B Partridge
*Assistant Examiner* — Gustavo G Ramallo
(74) *Attorney, Agent, or Firm* — WILLIAM PARK AND ASSOCIATES LTD.

(57) ABSTRACT

Provided herein is a memory device and a method of manufacturing the memory device. The memory device includes a first conductive layer extending in a first direction, a second conductive layer extending from the first conductive layer in a second direction intersecting the first direction, a plurality of first channel structures penetrating the first conductive layer and disposed to be spaced apart from each other in the first direction, and a plurality of second channel structures penetrating the second conductive layer, wherein the first conductive layer may form an interface with the second conductive layer, and the interface may be disposed between the plurality of first channel structures and the plurality of second channel structures.

16 Claims, 28 Drawing Sheets

MEMORY DEVICE INCLUDING INTERFACE BETWEEN CONDUCTIVE LAYERS

CROSS-REFERENCE TO RELATED APPLICATION

The present application claims priority under 35 U.S.C. § 119(a) to Korean patent application number 10-2023-0005521 filed on Jan. 13, 2023, in the Korean Intellectual Property Office, the entire disclosure of which is incorporated by reference herein.

BACKGROUND

1. Technical Field

Various embodiments of the present disclosure generally relate to a memory device and a method of manufacturing the memory device, and more particularly to a three-dimensional (3D) memory device and a method of manufacturing the 3D memory device.

2. Related Art

Memory devices may be classified into a volatile memory device in which stored data is lost when the supply of power is interrupted, and a nonvolatile memory device in which stored data is retained even when the supply of power is interrupted.

Examples of the nonvolatile memory device may include a NAND flash memory, a NOR flash memory, a resistive memory (or a resistive random access memory: ReRAM), a phase-change random access memory (PRAM), a magnetoresistive random access memory (MRAM), a ferroelectric random access memory (FRAM), a spin transfer torque random access memory (STT-RAM), etc.

Among the nonvolatile memory devices, a NAND flash memory system may include a memory device which stores data, and a controller which controls the memory device. The memory device may include a memory cell array which stores data, and peripheral circuits which perform a program operation, a read operation or an erase operation in response to a command transmitted from the controller.

The memory cell array may include a plurality of memory blocks, each of which may include a plurality of memory cells.

In order to increase the degree of integration of the memory device, various methods have been searched for.

SUMMARY

An embodiment of the present disclosure may provide for a memory device. The memory device may include a first conductive layer extending in a first direction, a second conductive layer extending from the first conductive layer in a second direction intersecting the first direction, a plurality of first channel structures penetrating the first conductive layer and disposed to be spaced apart from each other in the first direction, and a plurality of second channel structures penetrating the second conductive layer, wherein the first conductive layer may form an interface with the second conductive layer, and the interface may be disposed between the plurality of first channel structures and the plurality of second channel structures.

An embodiment of the present disclosure may provide for a memory device. The memory device may include a select line including a first select conductive layer extending in a first direction and a second select conductive layer extending from the first select conductive layer in a second direction intersecting the first direction, a word line including a plurality of first cell conductive layers and a second cell conductive layer, wherein the plurality of first cell conductive layers are disposed to be spaced apart from each other in the first direction to overlap the first select conductive layer, and the second cell conductive layer is configured to fill spaces between the plurality of first cell conductive layers and extend from the plurality of first cell conductive layers in the second direction, an insulating layer disposed between the word line and the select line, a plurality of first channel structures individually penetrating the plurality of first cell conductive layers and extending to penetrate the insulating layer and the first select conductive layer, and a plurality of second channel structures penetrating the second cell conductive layer and extending to penetrate the insulating layer and the second select conductive layer.

An embodiment of the present disclosure may provide for a method of manufacturing a memory device. The method may include forming a stacked body that includes a first area, a second area, and a separation area between the first area and the second area and in which a plurality of first material layers and a plurality of second material layers are alternately stacked, forming a plurality of first holes passing through the first area, the second area, and the separation area of the stacked body, forming a mask pattern configured to open a first group disposed in the separation area and block a second group disposed in the first area and the second area, among the plurality of first holes, forming a plurality of second holes by respectively etching the first material layers through the first group among the plurality of first holes, forming a first conductive layer in each of the plurality of second holes, and after the first conductive layer is formed, forming a channel structure in each of the first group and the second group of the plurality of first holes.

DETAILED DESCRIPTION

Specific structural or functional descriptions in the embodiments of the present disclosure introduced in this specification or application are provided as examples to describe embodiments according to the concept of the present disclosure. The embodiments according to the concept of the present disclosure may be practiced in various forms, and should not be construed as being limited to the embodiments described in the specification or application.

Terms such as "first", "second", and "third" described in this specification or application are only used for the purpose of differentiating a component from other components, and the order or number of components in the present disclosure should not be construed as being limited to those terms such as "first", "second", and "third."

Various embodiments of the present disclosure are directed to a memory device that enables the degree of integration to be increased and a method of manufacturing the memory device.

Figure 1:
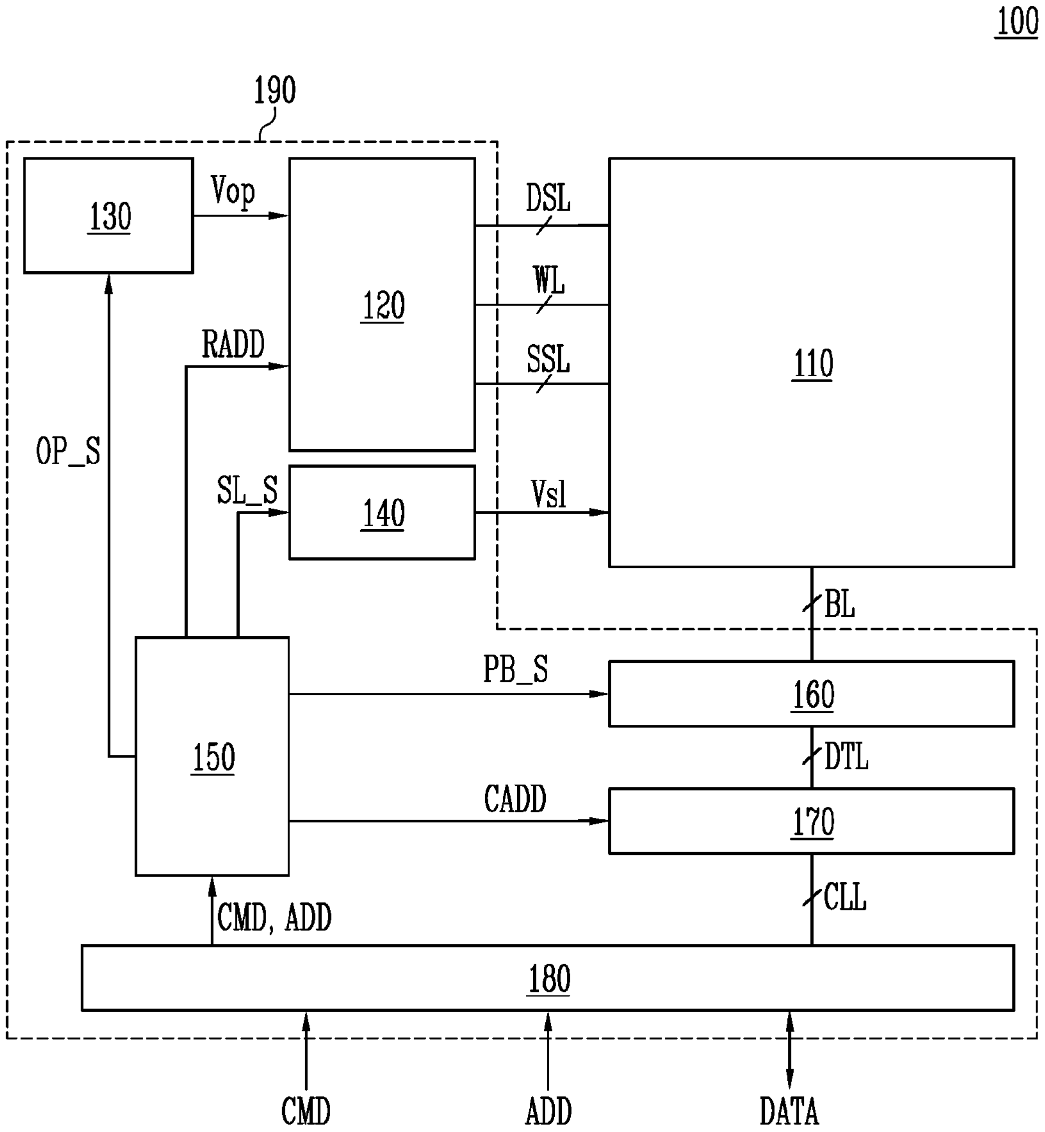
FIG. 1 is a diagram illustrating a memory device according to an embodiment of the present disclosure.

FIG. 1 is a diagram illustrating a memory device according to an embodiment of the present disclosure.

Referring to FIG. 1, a memory device 100 may include a peripheral circuit 190 and a memory cell array 110.

The peripheral circuit 190 may perform a program operation of storing data in the memory cell array 110 and a verify operation, perform a read operation of outputting data stored in the memory cell array 110, or perform an erase operation of erasing data stored in the memory cell array 110. The peripheral circuit 190 may include a voltage generation circuit 130, a row decoder 120, a source line driver 140, a control circuit 150, a page buffer 160, a column decoder 170, and an input-output circuit 180.

The memory cell array 110 may include a plurality of memory cells in which data is stored. In an embodiment, the memory cell array 110 may include a three-dimensional (3D) memory cell array. Each of the plurality of memory cells may store single-bit data or multi-bit data of two or more bits according to the program scheme. The plurality of memory cells may form a plurality of strings. Memory cells included in each of the strings may be electrically connected to each other through channels. Channels included in the strings may be coupled to the page buffer 160 through bit lines BL.

The voltage generation circuit 130 may generate various operating voltages Vop to be used in a program operation, a read operation, or an erase operation in response to an operation signal OP_S. For example, the voltage generation circuit 130 may selectively generate and output operating voltages Vop including a program voltage, a verify voltage, a pass voltage, a read voltage, an erase voltage, etc.

The row decoder 120 may be coupled to the memory cell array 110 through a plurality of drain select lines DSL, a plurality of word lines WL, and a plurality of source select lines SSL. The row decoder 120 may transfer the operating voltages Vop to the plurality of drain select lines DSL, the plurality of word lines WL, and the plurality of source select lines SSL in response to a row address RADD.

The source line driver 140 may transmit a source voltage Vsl to the memory cell array 110 in response to a source line control signal SL_S. For example, the source voltage Vsl may be transferred to a source line coupled to the memory cell array.

The control circuit 150 may output the operation signal OP_S, the row address RADD, the source line control signal SL_S, a page buffer control signal PB_S, and a column address CADD in response to a command CMD and an address ADD.

The page buffer 160 may be coupled to the memory cell array 110 through the bit lines BL. The page buffer 160 may store data DATA received through the plurality of bits lines BL in response to the page buffer control signal PB_S. The page buffer 160 may sense the voltages or currents of the plurality of bit lines BL during a read operation.

The column decoder 170 may transmit data DATA, received from the input-output circuit 180, to the page buffer 160 or transmit data DATA, stored in the page buffer 160, to the input-output circuit 180 in response to the column address CADD. The column decoder 170 may exchange the data DATA with the input-output circuit 180 through column lines CLL, and may exchange data DATA with the page buffer 160 through data lines DTL.

The input-output circuit 180 may transfer the command CMD and the address ADD, received from an external device (e.g., a controller) coupled to the memory device 100, to the control circuit 150, and may output data, received from the column decoder 170, to the external device.

Figure 2:
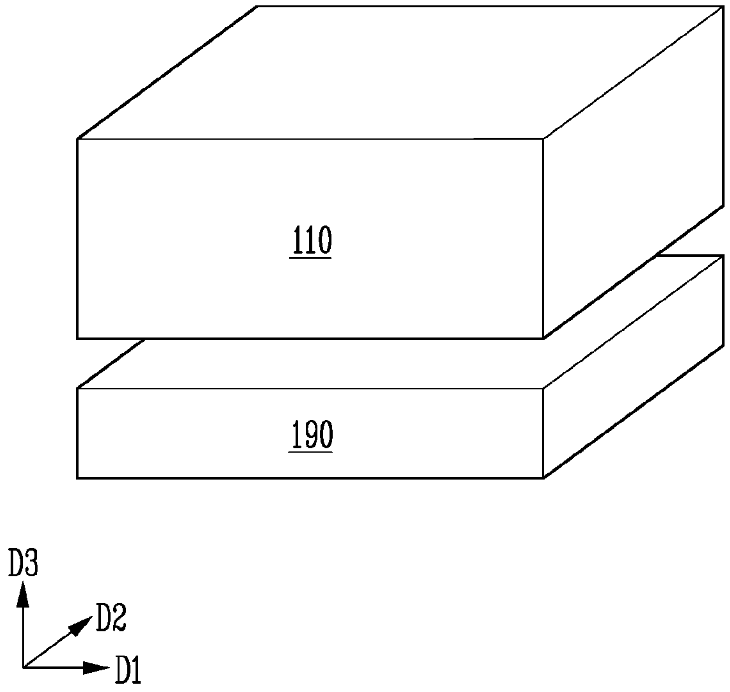
FIG. 2 is a diagram illustrating an arrangement structure of a memory cell array and a peripheral circuit.

FIG. 2 is a diagram illustrating an arrangement structure of a memory cell array and a peripheral circuit.

Referring to FIG. 2, a memory cell array 110 may be stacked on a peripheral circuit 190. The peripheral circuit 190 and the memory cell array 110 may be formed on a substrate extending along a first direction D1 and a second direction D2 intersecting each other. For example, the substrate may extend along an X-Y plane. The peripheral circuit 190 and the memory cell array 110 may be stacked in a third direction D3 intersecting the X-Y plane.

Figure 3:
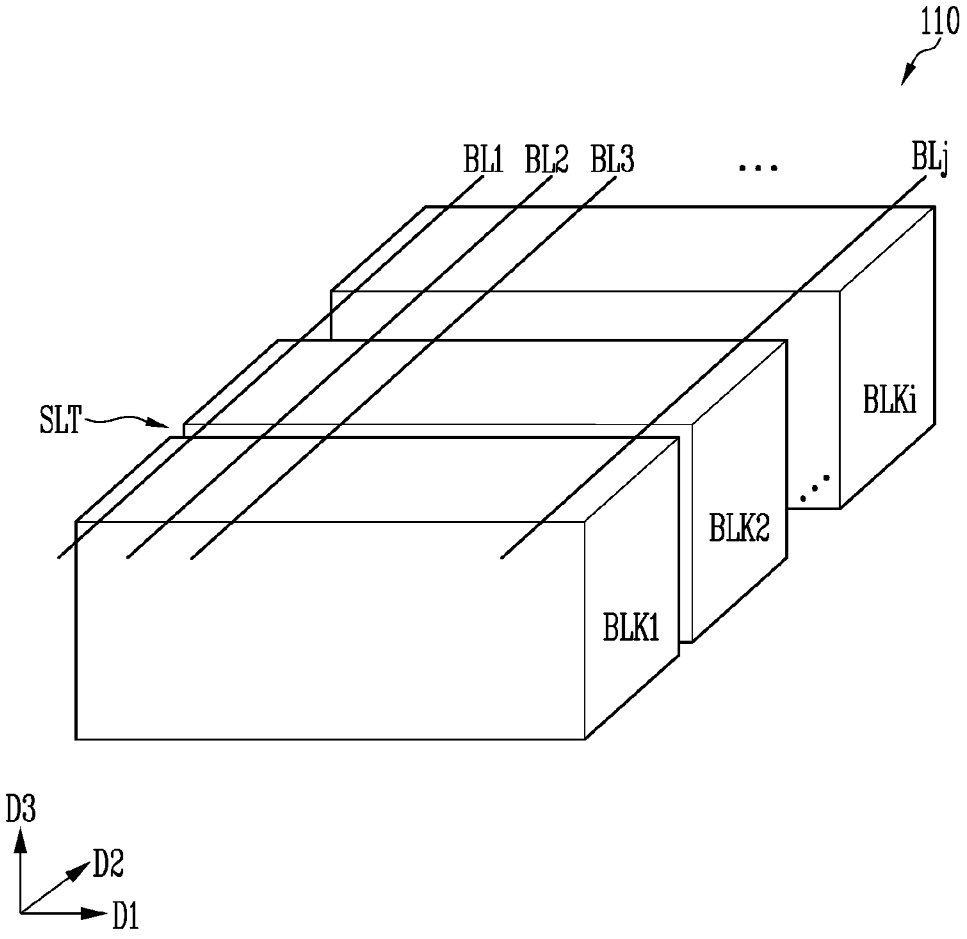
FIG. 3 is a diagram illustrating memory blocks.

FIG. 3 is a diagram illustrating memory blocks.

Referring to FIG. 3, the memory cell array 110 may include first to i-th memory blocks BLK1 to BLKi (where i is a positive integer). The first to i-th memory blocks BLK1 to BLKi may be coupled to first to j-th bit lines BL1 to BLj spaced apart from each other in a first direction D1. The first to i-th memory blocks BLK1 to BLKi may be arranged to be spaced apart from each other in a second direction D2. In an embodiment, the first to j-th bit lines BL1 to BLj (where j is a positive integer) may extend in the second direction D2, and may individually control the first to i-th memory blocks BLK1 to BLKi. The first to i-th memory blocks BLK1 to BLKi may be separated from each other by slits SLT.

Figure 4A:
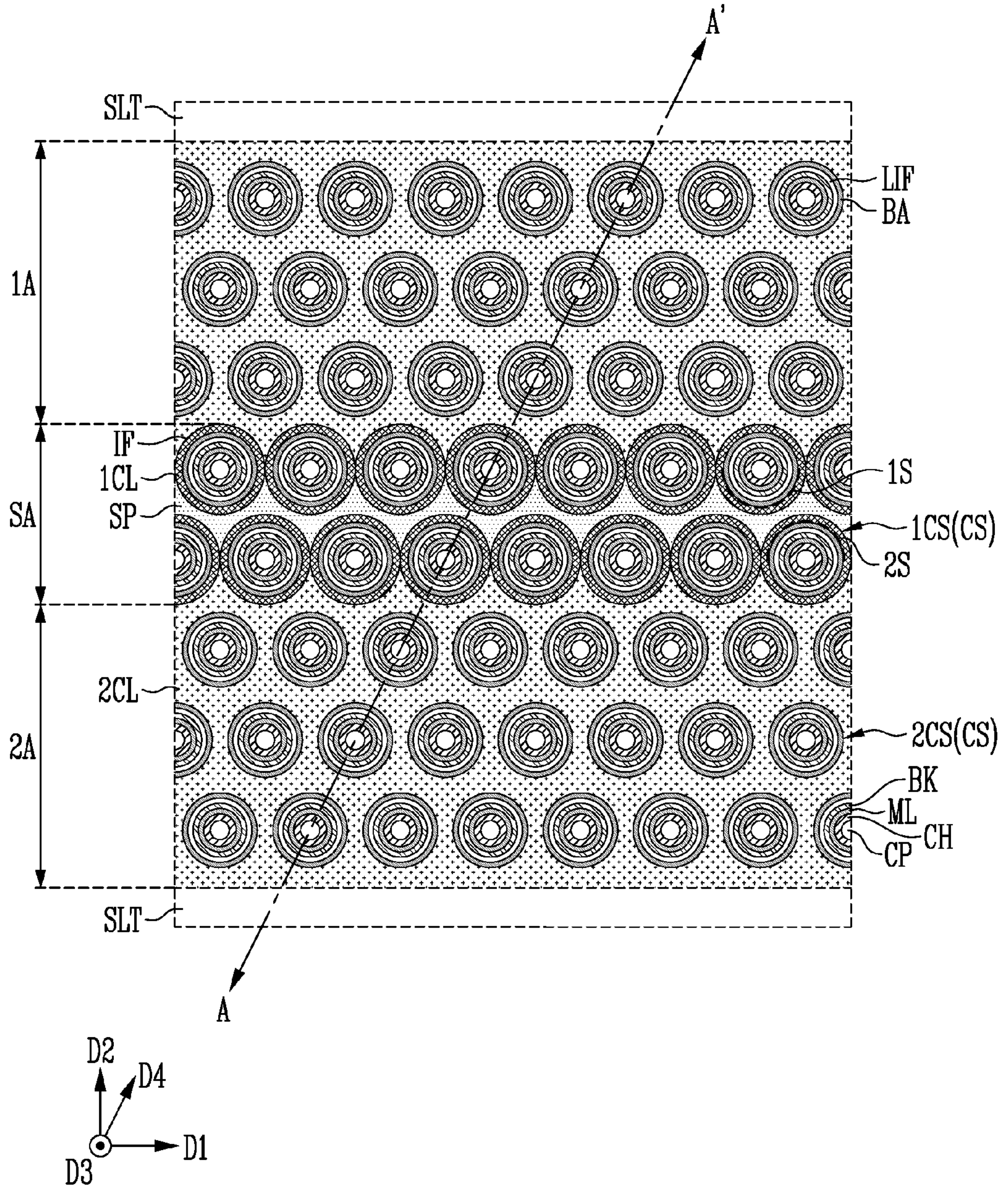
FIG. 4A is a view illustrating the layout of a memory device according to an embodiment of the present disclosure.

FIG. 4A is a view illustrating the layout of a memory device according to an embodiment of the present disclosure.

FIG. 4A representatively illustrates the layout of one of first to i-th memory blocks BLK1 to BLKi separated by the slits SLT of FIG. 3.

Referring to FIG. 4A, the memory block of the memory device according to an embodiment of the present disclosure may include a first area 1A, a second area 2A, and a separation area SA. The first area 1A and the second area 2A may extend in a first direction D1. The separation area SA may be disposed between the first area 1A and the second area 2A. The first area 1A and the second area 2A may be disposed to be spaced apart from each other with the separation area SA interposed therebetween.

The separation area SA may include a separation pattern SP extending in the first direction D1. The separation pattern SP may be a pattern for separating gate electrodes of the memory block. In an embodiment, the gate electrodes of the memory block may include select lines and word lines of a NAND flash memory device. The select lines may include source select lines and drain select lines, and the word lines may be stacked between the corresponding source select line and the corresponding drain select line. Each gate electrode may include a first conductive layer 1CL and a second conductive layer 2CL.

The first conductive layer 1CL may be adjacent to the separation pattern SP, and may extend in the first direction D1. The second conductive layer 2CL may be disposed in each of the first area 1A and the second area 2A, and may extend from the first conductive layer 1CL in a second direction D2 intersecting the first direction D1. The first conductive layer 1CL and the second conductive layer 2CL may be coupled to each other in the second direction D2. An interface IF may be formed between the first conductive layer 1CL and the second conductive layer 2CL. The interface IF may extend in the first direction D1.

The memory block may include a plurality of channel structures CS. The plurality of channel structures CS may be disposed in a plurality of columns spaced apart from each other in the first direction D1 and in a plurality of rows spaced apart from each other in the second direction D2. The plurality of channel structures CS may be disposed in various forms, and a method of disposing the plurality of channel structures CS is not limited to that illustrated in the drawing. In an embodiment, the plurality of channel structures CS may be disposed such that channel structures CS in a first row and channel structures CS in a second row are not located in the same column. In an embodiment, the plurality of channel structures CS may be disposed such that the channel structures CS in the first row and the channel structures CS in the second row are located in the same column.

The plurality of channel structures CS may penetrate gate electrodes corresponding thereto. The plurality of channel structures CS may include a plurality of first channel structures 1CS and a plurality of second channel structures 2CS. The plurality of first channel structures 1CS may be formed to penetrate the first conductive layer 1CL. Each of the plurality of first channel structures 1CS may be formed to be enclosed by the first conductive layer 1CL. The plurality of first channel structures 1CS may include first channel structures 1CS neighboring each other in the first direction D1. The first channel structures 1CS neighboring each other in the first direction may be disposed to be spaced apart from each other with the first conductive layer 1CL interposed therebetween. The plurality of second channel structures 2CS may be formed to penetrate the second conductive layer 2CL. The plurality of second channel structures 2CS may be disposed to be spaced apart from each other with the second conductive layer 2CL interposed therebetween in the first direction D1, and may be disposed to be spaced apart from each other with the second conductive layer 2CL interposed therebetween in the second direction D2. Each of the second channel structures 2CS may be formed to be enclosed by the second conductive layer 2CL.

The shapes of the first channel structures 1CS and the second channel structures 2CS are not limited to those illustrated in the drawing, and the first channel structures 1CS and the second channel structures 2CS may be formed in various shapes, for example, a circular shape, an elliptical shape, or a polygonal shape, etc.

The first conductive layer 1CL may be formed along the profiles of the first channel structures 1CS. In an embodiment, when the first channel structures 1CS include an uneven shape, the first conductive layer 1CL may be formed to be uneven along the profiles of the first channel structures 1CS. In an embodiment, when the first channel structures 1CS are formed in a circular shape, the first conductive layer 1CL enclosing each of the first channel structures 1CS may be formed in a shape in which circles are coupled in a line in the first direction D1.

The interface IF may be disposed between the first channel structures 1CS and the second channel structures 2CS. The interface IF may be formed along the profiles of the first channel structures 1CS. In an embodiment, when the first channel structures 1CS include an uneven shape, the interface IF may be formed to be uneven along the profiles of the first channel structures 1CS. In detail, the interface IF may be formed to protrude toward a space between the first channel structures 1CS neighboring each other in the first direction D1. In an embodiment, when the first channel structures 1CS are formed in a circular shape, the interface IF may be formed to include arcs along the profiles of the first channel structures 1CS. For example, when the interface IF includes arcs along the profiles of the first channel structures 1CS the interface IF may include an arc shape as shown in FIG. 4A.

The second conductive layer 2CL may be formed along the profiles of the first channel structures 1CS. In an embodiment, when the first channel structures 1CS include an uneven shape, the second conductive layer 2CL may be formed to be uneven along the profiles of the first channel structures 1CS. In detail, the second conductive layer 2CL may be formed to protrude toward a space between the first channel structures 1CS. In an embodiment, when the first channel structures 1CS are formed in a circular shape, the second conductive layer 2CL may be formed to include arcs along the profiles of the first channel structures 1CS.

The first conductive layer 1CL may be coupled to the separation pattern SP. The separation pattern SP may be disposed to be spaced apart from the second conductive layer 2CL with the first conductive layer 1CL interposed therebetween. The separation pattern SP may be formed between the plurality of first channel structures 1CS adjacent to the first area 1A and the plurality of first channel structures 1CS adjacent to the second area 2A. The separation pattern SP may be formed along the profiles of the first channel structures 1CS. In an embodiment, when the first channel structures 1CS include an uneven shape, the separation pattern SP may be formed to be uneven along the profiles of the first channel structures 1CS. In detail, the separation pattern SP may be formed to protrude toward the second channel structure 2CS between the first channel structures 1CS neighboring each other in the first direction D1. For example, the separation pattern SP may include one or more protrusions between the plurality of first channel structures 1CS that protrude toward the second channel structures 2CS as shown in FIG. 4A. Each of the plurality of first channel structures 1CS adjacent to the first area 1A may include a first side portion 1S facing the separation pattern SP, and each of the plurality of first channel structures 1CS adjacent to the second area 2A may include a second side portion 2S facing the separation pattern SP. The sidewall of the separation pattern SP may be formed in a structure corresponding to the structures of the first side portion 1S and the second side portion 2S. In an embodiment, when each of the first side portion 1S and the second side portion 2S is formed in an arc shape, the separation pattern SP may be formed to include arc shapes.

When the first conductive layer 1CL adjacent to the first area 1A and the first conductive layer 1CL adjacent to the second area 2A may be spaced apart from each other with the separation pattern SP interposed therebetween, they may be electrically isolated from each other by the separation pattern SP. The separation pattern SP may be formed of an insulating material to electrically isolate the first conductive layer 1CL adjacent to the first area 1A from the first conductive layer 1CL adjacent to the second area 2A. The separation pattern SP may be formed of a material selected in consideration of a replace process of forming a gate electrode. In an embodiment, the separation pattern SP may be made of a nitride.

In an embodiment, the gate electrode may be formed by performing a primary replace process of replacing a first material layer with the first conductive layer 1CL and a secondary replace process of replacing the first material layer with the second conductive layer 2CL. The primary replace process may be controlled to allow a portion of the first material layer to remain. Here, the remaining portion of the first material layer may be used as the separation pattern SP. Accordingly, in an embodiment, because a separate photolithography process of forming the separation pattern SP may be skipped, the process of manufacturing the memory device may be simplified. Furthermore, in an embodiment, the first conductive layer 1CL and the second conductive layer 2CL of the first area 1A may be electrically isolated from the first conductive layer 1CL and the second conductive layer 2CL of the second area 2A by controlling the etching amount of the first material layer, thus improving the degree of integration of the memory device. Furthermore, in an embodiment, the first conductive layer 1CL is disposed between the first channel structures 1CS neighboring each other in the first direction D1 and is formed to be seamlessly coupled to each other in the first direction D1, and thus the first conductive layer 1CL may function as a barrier which protects the first material layer remaining as the separation pattern SP in the secondary replace process performed through the slits SLT. Accordingly, in an embodiment, the stability of the process of manufacturing the memory device may be improved.

Figure 4B:
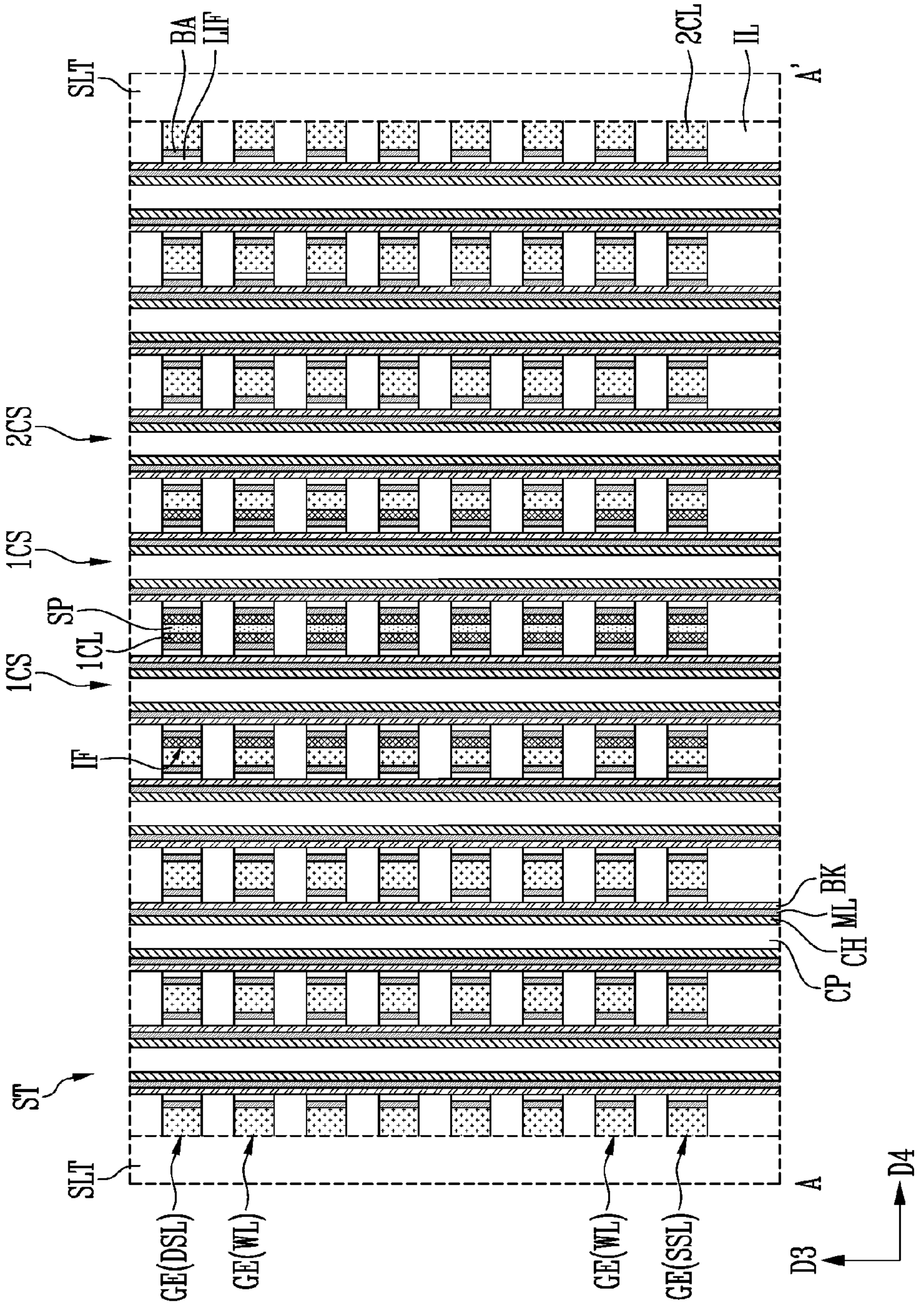
FIG. 4B is a sectional view of a memory device taken along line A-A' of FIG. 4A.

FIG. 4B is a sectional view of a memory device taken along line A-A' of FIG. 4A.

Referring to FIG. 4B, a plurality of separation patterns SP may be stacked to be spaced apart from each other in a third direction D3. Stacked bodies ST may be formed on both sides of the plurality of separation patterns SP. Each stacked body ST may include a plurality of gate electrodes GE and a plurality of insulating layers IL that are alternately disposed in the third direction D3. The plurality of gate electrodes GE may be used as a source select line SSL, a plurality of word lines WL, and a drain select line DSL. The plurality of gate electrodes GE may include a plurality of first and second conductive layers 1CL and 2CL. Each gate electrode GE may include a first conductive layer 1CL and a second conductive layer 2CL coupled to each other. The first conductive layer 1CL and the second conductive layer 2CL of the gate electrode GE used as the source select line SSL or the drain select line DSL may be defined as a first select conductive layer and a second select conductive layer, respectively. The first conductive layer 1CL and the second conductive layer 2CL of the gate electrode GE used as each word line WL may be defined as a first cell conductive layer and a second cell conductive layer, respectively. The plurality of first conductive layers 1CL may be formed to be spaced apart from each other with the insulating layers IL interposed therebetween. The plurality of second conductive layers 2CL may be formed to be spaced apart from each other with the insulating layers IL interposed therebetween. The plurality of first and second conductive layers 1CL and 2CL and the plurality of insulating layers IL may be stacked in the third direction D3. The third direction D3 may be a direction intersecting the direction in which the plurality of insulating layers IL extend.

The plurality of first channel structures 1CS may extend in the third direction D3 in each stacked body ST.

The plurality of separation patterns SP may be formed between neighboring stacked bodies ST. The separation patterns SP may be formed to be spaced apart from each other with the insulating layers IL interposed therebetween in the third direction D3. Each of the plurality of separation patterns SP may be formed between the first conductive layers 1CL at the same level.

Referring to FIGS. 4A and 4B, each of the first channel structures 1CS and the second channel structures 2CS may include a blocking layer BK, a memory layer ML, a channel layer CH, and a core pillar CP. Although not illustrated in FIGS. 4A and 4B, each of the first channel structures 1CS and the second channel structures 2CS may further include a capping layer (not illustrated) overlapping the core pillar CP in the third direction D3. The capping layer (not illustrated) may be formed of a conductive material. For example, the capping layer (not illustrated) may be formed of a doped polysilicon layer. The core pillar CP may be formed of an insulating material or a conductive material. The channel layer CH may extend along the sidewall of each of the capping layer (not illustrated) and the core pillar CP. The channel layer CH may be formed of a semiconductor material. For example, the channel layer CH may be formed of a silicon layer. Although not illustrated in FIGS. 4A and 4B, a tunnel insulating layer may be disposed between the memory layer ML and the channel layer CH. The tunnel insulating layer may extend along the sidewall of the channel layer CH. The tunnel insulating layer may be formed to enclose the channel layer CH, and may be formed of an insulating material. For example, the tunnel insulating layer may be formed of an oxide layer such as a silicon oxide layer. The memory layer ML may extend along the sidewall of the channel layer CH. The memory layer ML may be formed to enclose the channel layer CH. The memory layer ML may include a material, such a charge trap layer, a variable resistance layer, or nanodots, which may store data in various manners. For example, the memory layer ML may be formed of a nitride layer capable of trapping charges. The blocking layer BK may extend along the sidewall of the memory layer ML. The blocking layer BK may be formed to enclose the memory layer ML, and may be formed of an insulating material. For example, the blocking layer BK may be formed of an oxide layer such as a silicon oxide layer.

The memory device may further include a liner insulating layer LIF and a barrier layer BA, which enclose each of the first channel structures 1CS and the plurality of second channel structures 2CS. The liner insulating layer LIF may be formed to enclose the blocking layer BK and may be formed of an insulating material. For example, the liner insulating layer LIF may be formed of an oxide such as aluminum oxide. The barrier layer BA may be formed to enclose the liner insulating layer LIF, and may be formed of an insulating material. For example, the barrier layer BA may be formed of a nitride such as a titanium nitride. The liner insulating layer LIF may be formed at the same level as the plurality of first conductive layers 1CL and second conductive layers 2CL. The liner insulating layer LIF may be spaced apart from a neighboring liner insulating layer LIF in the third direction D3 with the corresponding insulating layer IL interposed therebetween. The liner insulating layer LIF and the barrier layer BA may be interposed between the first conductive layer 1CL or the second conductive layer 2CL and the blocking layer BK. The barrier layer BA may be formed at the same level as the plurality of first conductive layers 1CL and second conductive layers 2CL. The barrier layer BA may be spaced apart from a neighboring barrier layer BA in the third direction D3 with the corresponding insulating layer IL interposed therebetween.

Figure 5A:
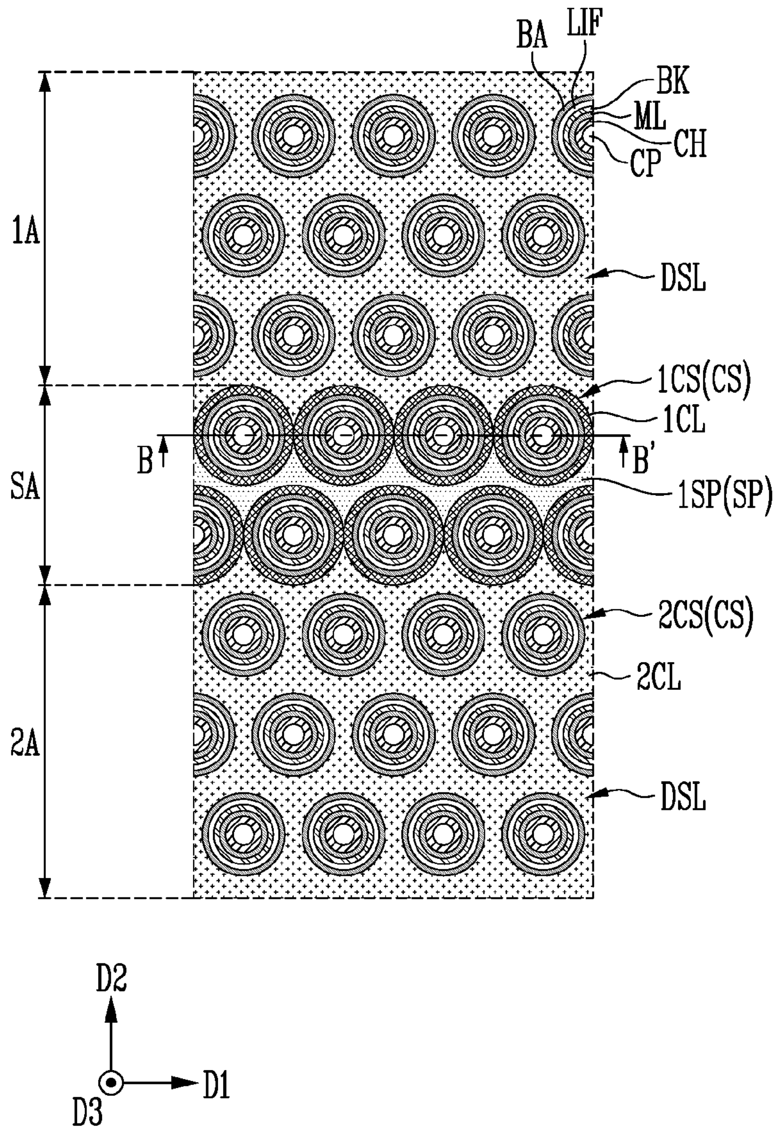
FIGS. 5A and 5B are diagrams for explaining a select line and a word line of a memory device according to an embodiment of the present disclosure.
Figure 5B:
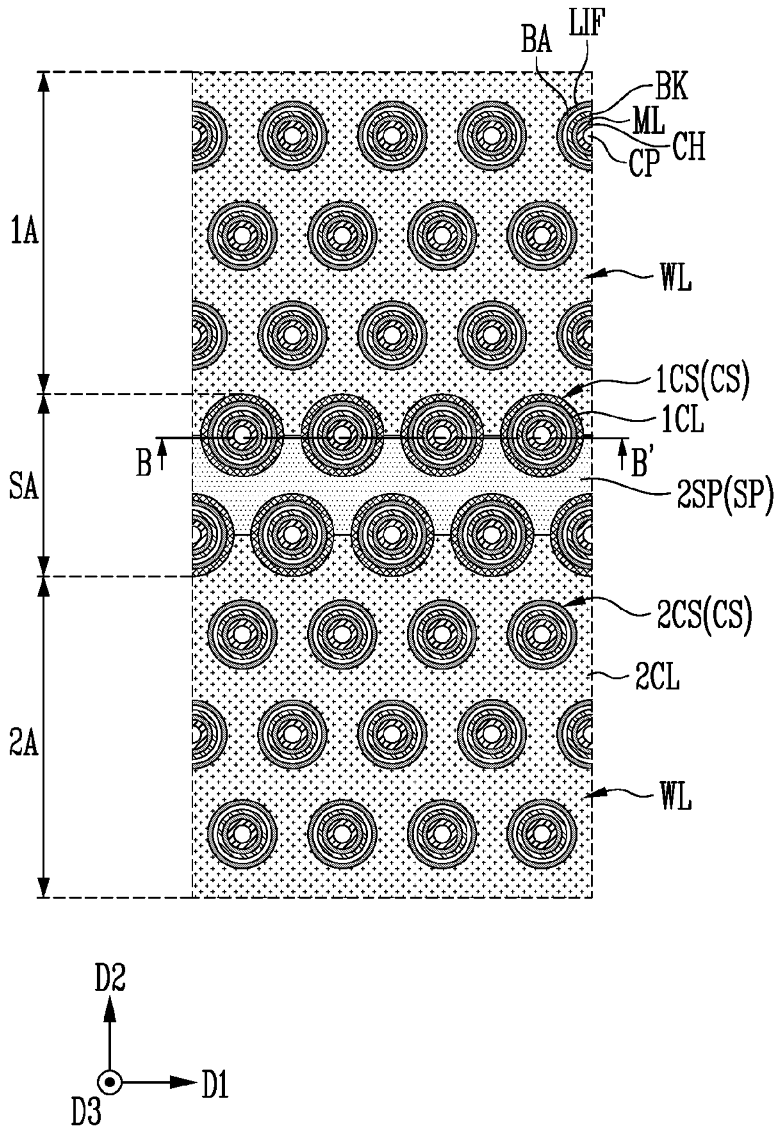
Figure 6:
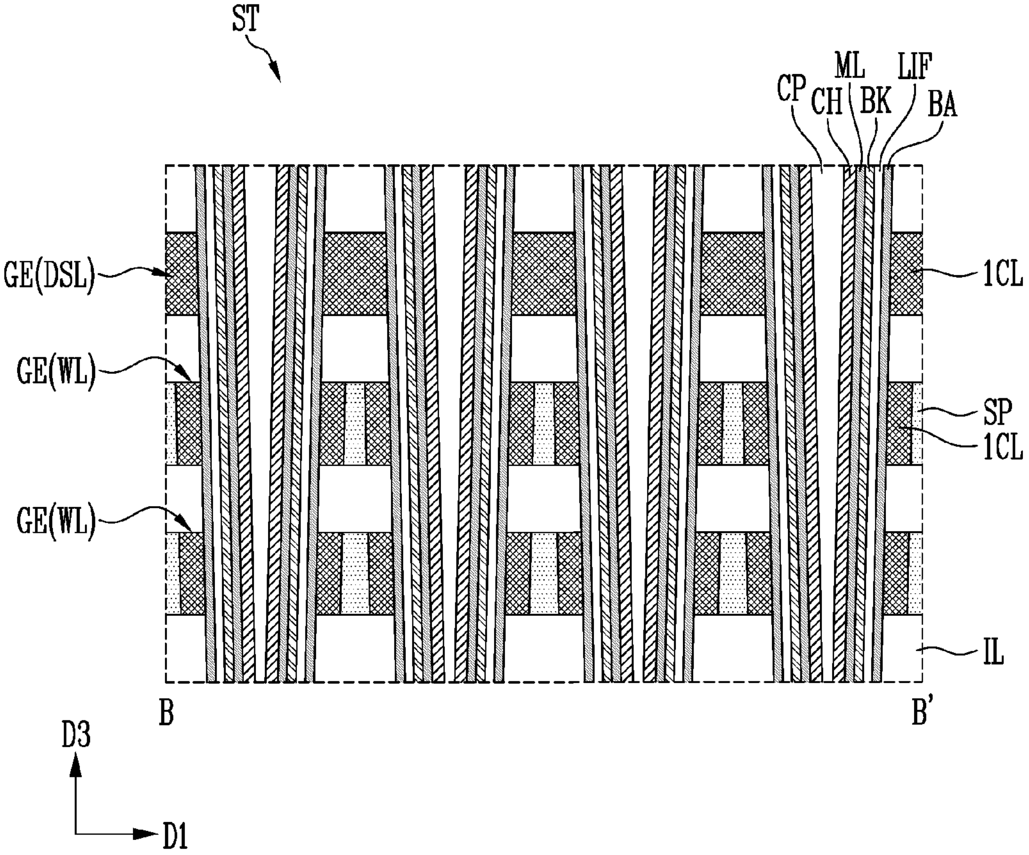
FIG. 6 is a sectional view of a memory device taken along line B-B' of FIGS. 5A and 5B according to an embodiment of the present disclosure.

FIGS. 5A and 5B are diagrams for explaining a select line and a word line of a memory device according to an embodiment of the present disclosure. FIG. 6 is a sectional view of a memory device taken along line B-B' of FIGS. 5A and 5B according to an embodiment of the present disclosure.

Referring to FIGS. 5A, 5B, and 6, the memory device may include a separation area SA, a first area 1A, and a second area 2A, as described above with reference to FIG. 4A. As described above with reference to FIG. 4B, the memory device may include a plurality of separation patterns SP stacked to be spaced apart from each other in a third direction D3, and a stacked body ST disposed on both sides of the separation patterns SP.

As described above with reference to FIG. 4B, the stacked body ST may include a plurality of gate electrodes GE and a plurality of insulating layers IL that are alternately disposed in the third direction D3. FIG. 5A illustrates the layout of a layer on which drain select lines DSL, among the plurality of gate electrodes GE, are disposed, and FIG. 5B illustrates the layout of a layer on which word lines WL, among the plurality of gate electrodes GE, are disposed. FIG. 6 is a sectional view illustrating a drain select line DSL and several word lines WL adjacent thereto, among the plurality of gate electrodes GE. Hereinafter, components identical to those illustrated in FIGS. 4A and 4B will be described in brief, or repeated descriptions thereof will be omitted.

The plurality of gate electrodes GE may include a plurality of first and second conductive layers 1CL and 2CL. Each gate electrode GE may include a first conductive layer 1CL and a second conductive layer 2CL coupled to each other. The first conductive layer 1CL and the second conductive layer 2CL of the gate electrode GE used as the drain select line DSL may be defined as a first select conductive layer and a second select conductive layer, respectively. The first conductive layer 1CL and the second conductive layer 2CL of the gate electrode GE used as each word line WL may be defined as a first cell conductive layer and a second cell conductive layer, respectively.

In the stacked body ST, a plurality of channel structures CS may be formed. The plurality of channel structures CS may extend in the third direction D3 to penetrate the plurality of gate electrodes GE. In an embodiment, the channel structures CS may be formed such that the width of each of the channel structures CS gradually increases in the third direction D3, which is a stacking direction. According to an embodiment of the present disclosure, each channel structure CS may be formed to have a width smaller at the level at which the word lines WL are disposed than at the level at which the drain select line DSL is disposed. Further, a separation distance between neighboring channel structures CS may be formed to be longer or greater at the level at which the word lines WL are disposed than at the level at which the drain select line DSL is disposed.

The plurality of channel structures CS may include a plurality of first channel structures 1CS penetrating the plurality of first conductive layers 1CL and a plurality of second channel structures 2CS penetrating the plurality of second conductive layers 2CL. In an embodiment, the first channel structures 1CS may be formed such that the width of each of the first channel structures 1CS gradually increases in the third direction D3, which is a stacking direction. The plurality of first channel structures 1CS may include first channel structures 1CS neighboring each other in the first direction D1. Further, a separation distance between the first channel structures 1CS neighboring each other in the first direction D1 may be formed to be longer at the level at which the word lines WL are disposed than at the level at which the drain select line DSL is disposed. Each of the first conductive layers 1CL may enclose the outer surface of the corresponding first channel structure 1CS at uniform thickness. The first select conductive layer, which is the first conductive layer 1CL of the drain select line DSL, may seamlessly extend in the first direction D1 between the first channel structures 1CS neighboring each other in the first direction D1. On the other hand, the plurality of first cell conductive layers, which are the plurality of first conductive layers 1CL of the word lines WL, might not fill spaces between the first channel structures 1CS neighboring each other in the first direction D1, and may be spaced apart from each other in the first direction D1 while respectively enclosing the plurality of first channel structures 1CS. The plurality of first cell conductive layers of the word lines WL may overlap the first select conductive layer of the drain select line DSL.

Each of the first conductive layers 1CL may enclose the outer surface of the corresponding first channel structure 1CS at uniform thickness. The first select conductive layer, which is the first conductive layer 1CL of the drain select line DSL, may seamlessly extend in the first direction D1 between the first channel structures 1CS neighboring each other in the first direction D1. On the other hand, the plurality of first cell conductive layers, which are the plurality of first conductive layers 1CL of the word lines WL, might not fill spaces between the first channel structures 1CS neighboring each other in the first direction D1, and may be spaced apart from each other in the first direction D1 while respectively enclosing the plurality of first channel structures 1CS.

The plurality of separation patterns SP may include a first separation pattern 1SP and a second separation pattern 2SP. The first separation pattern 1SP may be defined as being formed at the same level as the drain select line DSL, and the second separation pattern 2SP may be defined as being formed at the same level as the word lines WL. An area occupied by the separation patterns SP in the stacked body may vary depending on the level at which the separation patterns SP are located in the stacked body. In an embodiment, the first separation pattern 1SP may be formed to have an area smaller than that of the second separation pattern 2SP.

Apart from the above-described embodiment, the second separation pattern 2SP might not remain, and may be replaced with the second conductive layer 2CL at the level at which the word lines WL are disposed. As described above with reference to FIGS. 4A and 4B, the second conductive layer 2CL may be formed by performing a secondary replace process using slits SLT. In this case, unlike the first separation pattern 1SP, the second separation pattern 2SP may be exposed to the outside between the plurality of first conductive layers 1CL at the level at which the word lines WL are disposed, and thus an etching process may be controlled such that the second separation pattern 2SP is removed while the secondary replace process is performed. In this case, at the level at which the word lines WL are disposed, the second conductive layer 2CL might not only extend to a space between the first conductive layers 1CL, neighboring each other in the first direction D1, but also extend to overlap the first separation pattern 1SP. According to this structure, the second conductive layer 2CL of the word lines WL may extend to the separation area SA, and may also seamlessly extend from the first area 1A to the second area 2A.

Figure 7:
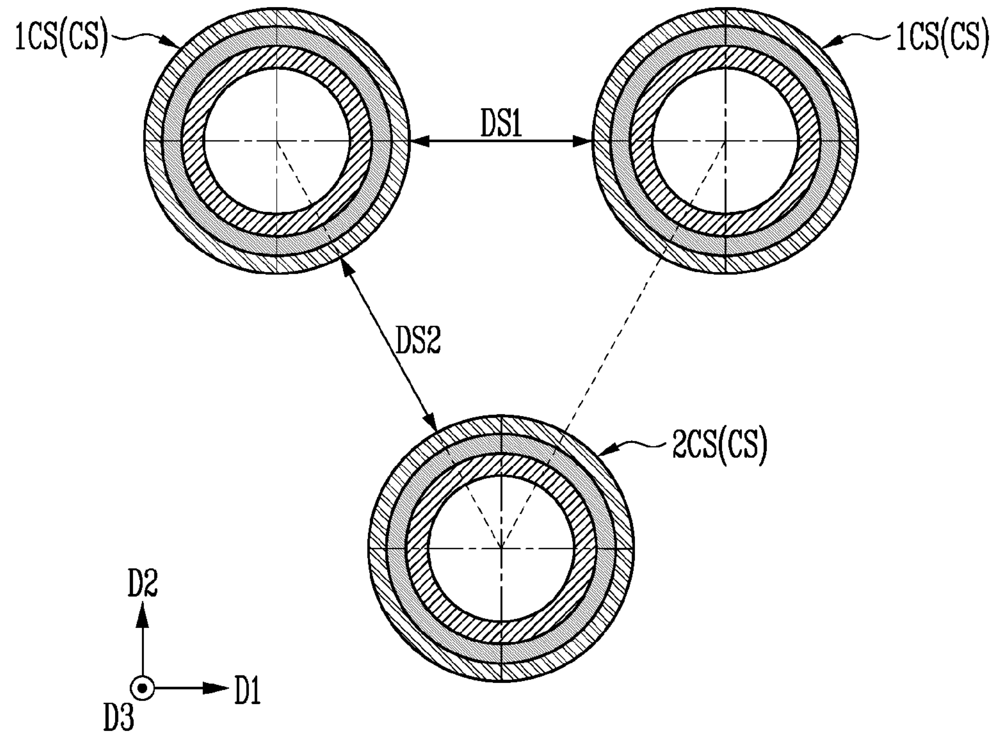
FIG. 7 is an enlarged view illustrating channel structures of a memory device according to an embodiment of the present disclosure.

FIG. 7 is an enlarged view illustrating channel structures of a memory device according to an embodiment of the present disclosure.

Referring to FIG. 7, first channel structures 1CS neighboring each other in a first direction D1 may be spaced apart from each other by a first distance DS1. Each first channel structure 1CS and a second channel structure 2CS adjacent thereto may be spaced apart from each other by at least a second distance DS2. In an embodiment, the first distance DS1 may be formed to be shorter than the second distance DS2. Because the first distance DS1 is formed to be shorter than the second distance DS2, a first conductive layer 1CL at the level at which a drain select line DSL is disposed may continuously block the first separation pattern 1SP between the first channel structures 1CS neighboring each other in the first direction D1, as illustrated in FIGS. 4A and 5A. In an embodiment, because the first distance DS1 is formed to be shorter than the second distance DS2, a first conductive layer 1CL at the level at which a drain select line DSL is disposed may exclude the first separation pattern 1SP from being between the first channel structures 1CS neighboring each other in the first direction D1, as illustrated in FIGS. 4A and 5A.

FIGS. 8A to 8G are plan views for explaining a method of manufacturing a memory device according to an embodiment of the present disclosure.

FIGS. 9A to 9G are sectional views for explaining a method of manufacturing a memory device according to an embodiment of the present disclosure.

Figure 8A:
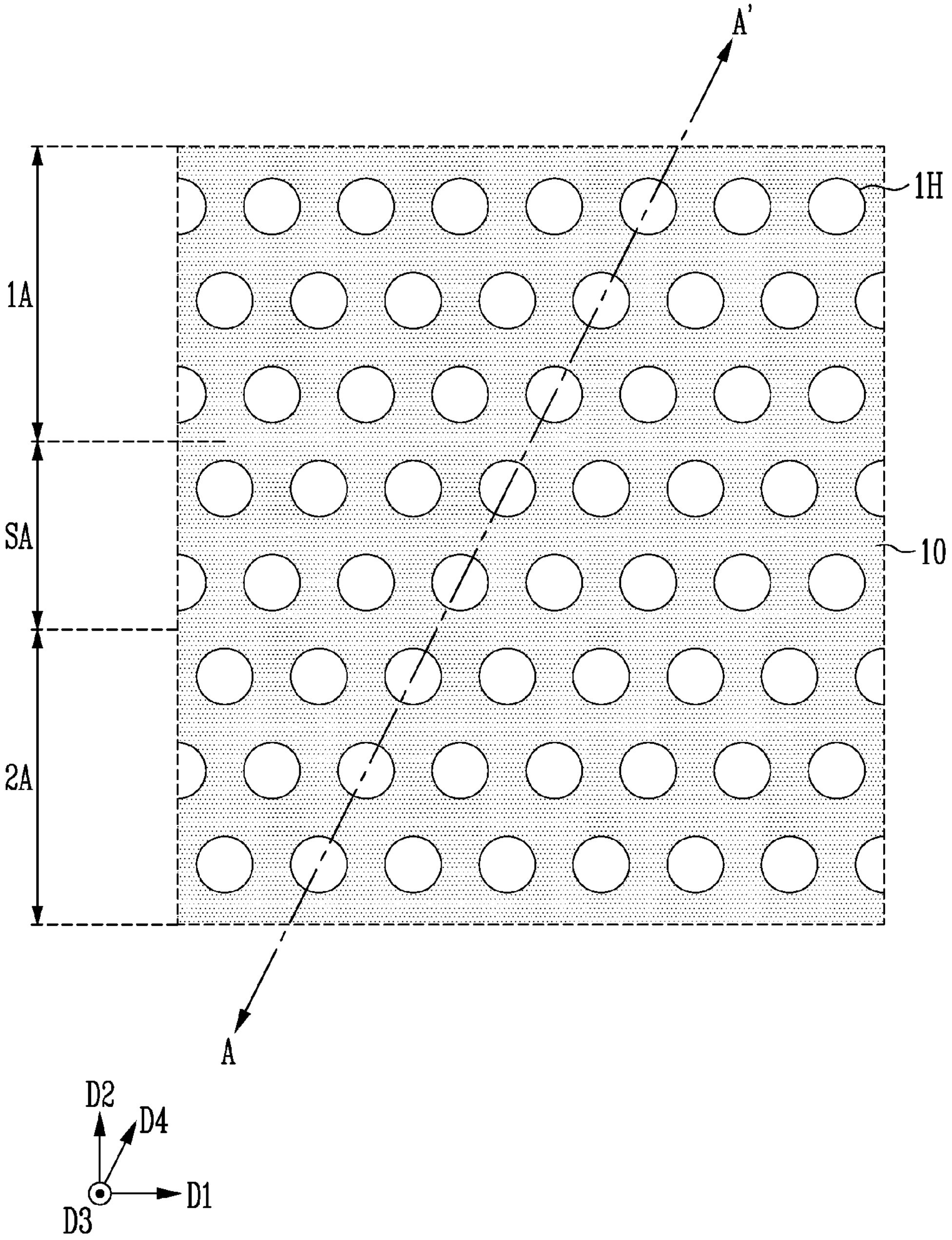
FIGS. 8A, 8B, 8C, 8D, 8E, 8F, and 8G are plan views for explaining a method of manufacturing a memory device according to an embodiment of the present disclosure.
Figure 9A:
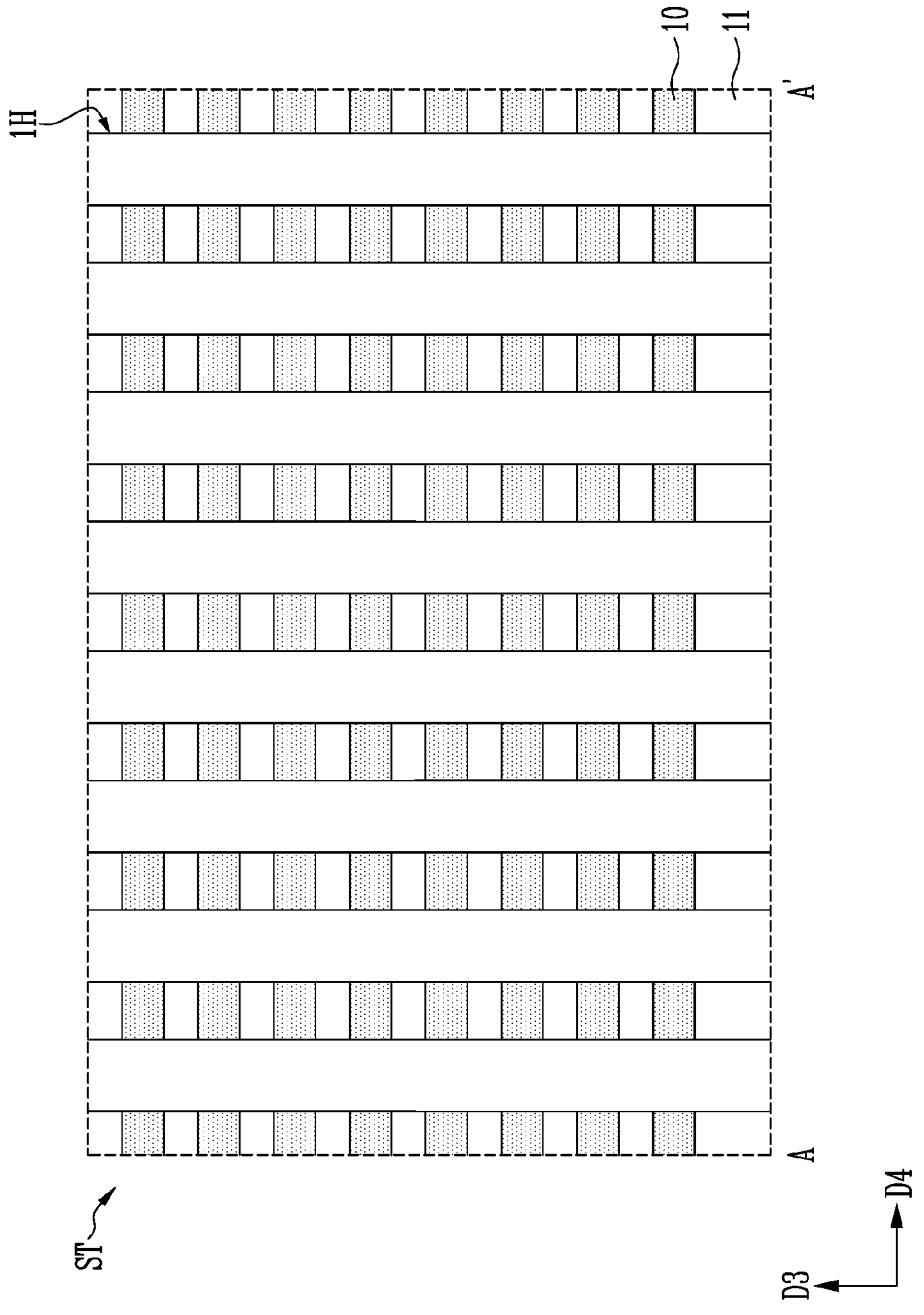
FIGS. 9A, 9B, 9C, 9D, 9E, 9F, and 9G are sectional views for explaining a method of manufacturing a memory device according to an embodiment of the present disclosure.

Referring to FIGS. 8A and 9A, a stacked body ST in which a plurality of first material layers 10 and a plurality of second material layers 11 are alternately stacked may be formed. The stacked body ST may be stacked on a source layer (not illustrated) and a lower structure (not illustrated). The lower structure (not illustrated) may be a structure including a substrate or peripheral circuits. Because the source layer (not illustrated) is a layer used as a source line, it may be formed of a conductive material. For example, the source layer (not illustrated) may be formed of a conductive material, such as doped silicon, tungsten, or nickel. Each of the second material layers 11 may include an insulating material for the insulating layers IL, illustrated in FIGS. 4B and 6. Each of the first material layers 10 may be formed of a material that can be selectively removed in a subsequent process. That is, the first material layers 10 may be formed of a material having an etch selectivity of more than 1 with respect to the second material layers 11. In an embodiment, each of the first material layers 10 may include a nitride layer such as a silicon nitride layer, and each of the second material layers 11 may include an oxide layer such as a silicon oxide layer.

The first material layers 10 and the second material layers 11 may be plate-type layers extending in a first direction D1 and a second direction D2 intersecting each other. The first material layers 10 and the second material layers 11 may be stacked in a third direction D3 intersecting the plate defined by the first material layers 10 or the second material layers 11.

Next, a plurality of first holes 1H passing through the stacked body ST in the third direction D3 may be formed. In order to form the plurality of first holes 1H, an etching process of removing portions of the first and second material layers 10 and 11 may be performed. In an embodiment, the plurality of first holes 1H may be formed by etching the first and second material layers 10 and 11 through a dry-etching process. The first and second material layers 10 and 11 may be exposed through respective inner walls of the first holes 1H. The stacked body ST may include a first area 1A, a second area 2A, and a separation area SA between the first area 1A and the second area 2A. The plurality of first holes 1H may be divided into a first group disposed in the separation area SA and a second group disposed in the first area 1A and the second area 2A.

Figure 8B:
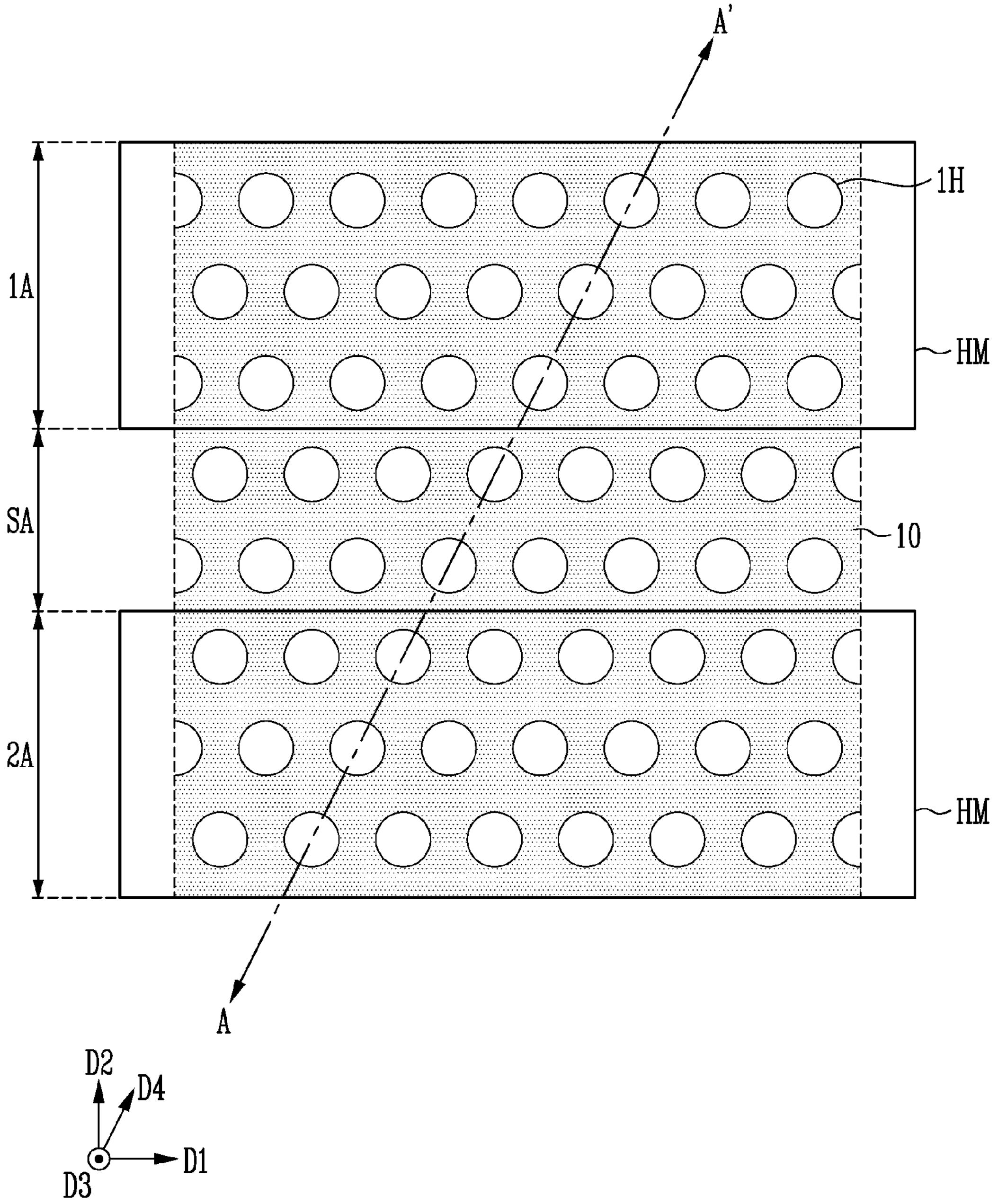
Figure 9B:
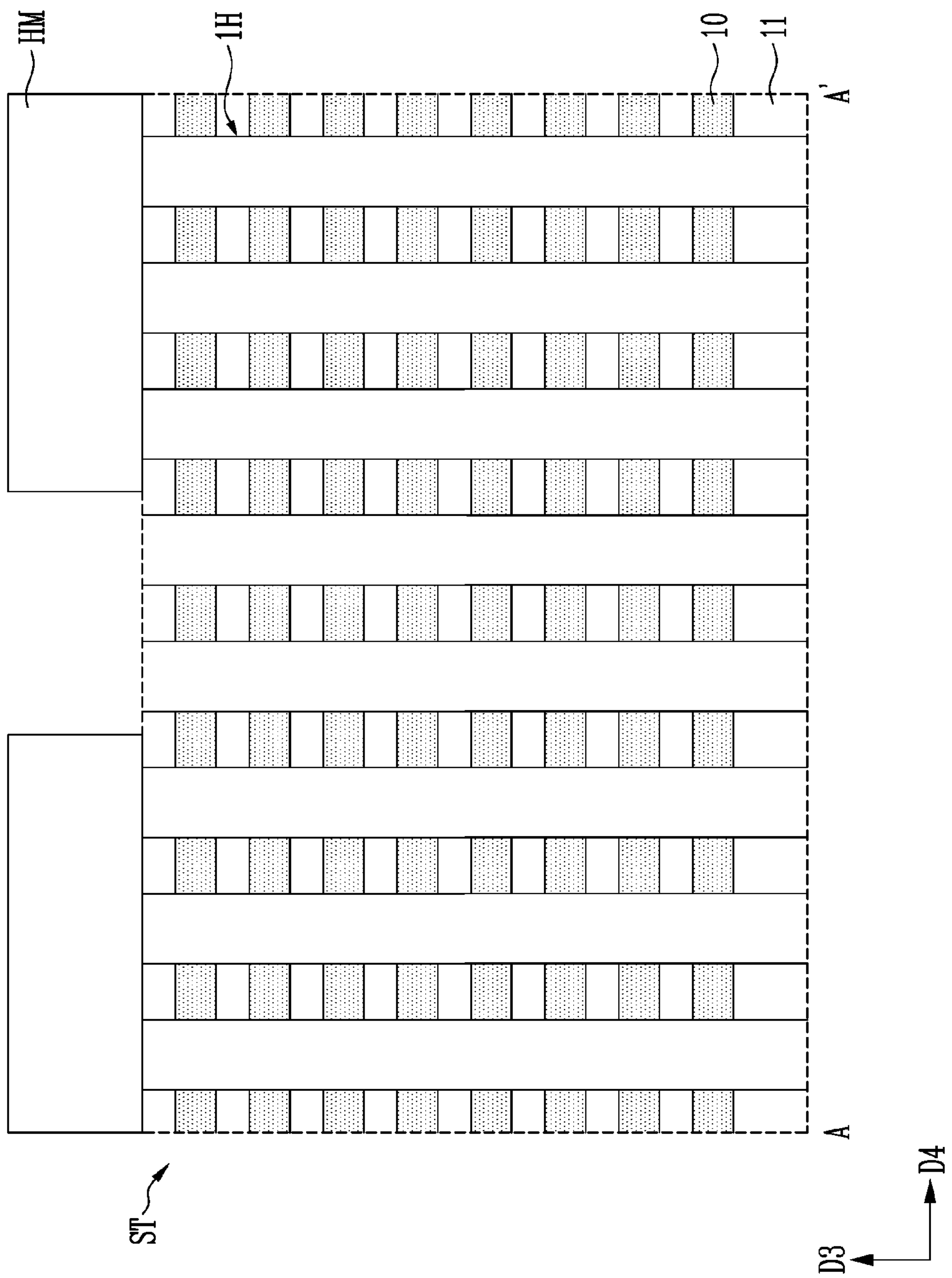

Referring to FIGS. 8B and 9B, a hard mask pattern HM for opening the first group disposed in the separation area SA and blocking the second group disposed in the first area 1A and the second area 2A, among the plurality of first holes 1H, may be formed on the stacked body ST.

Figure 8C:
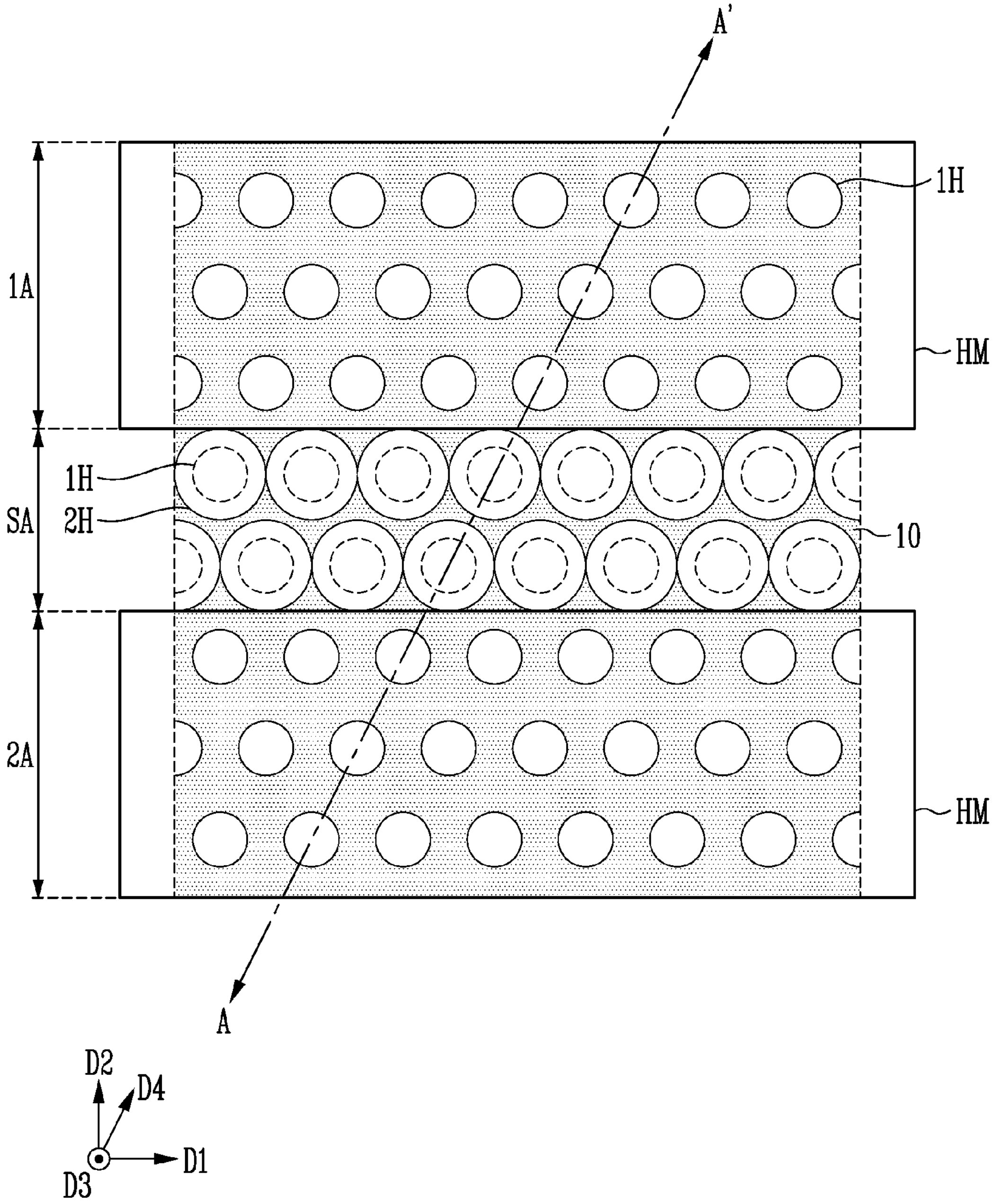
Figure 9C:
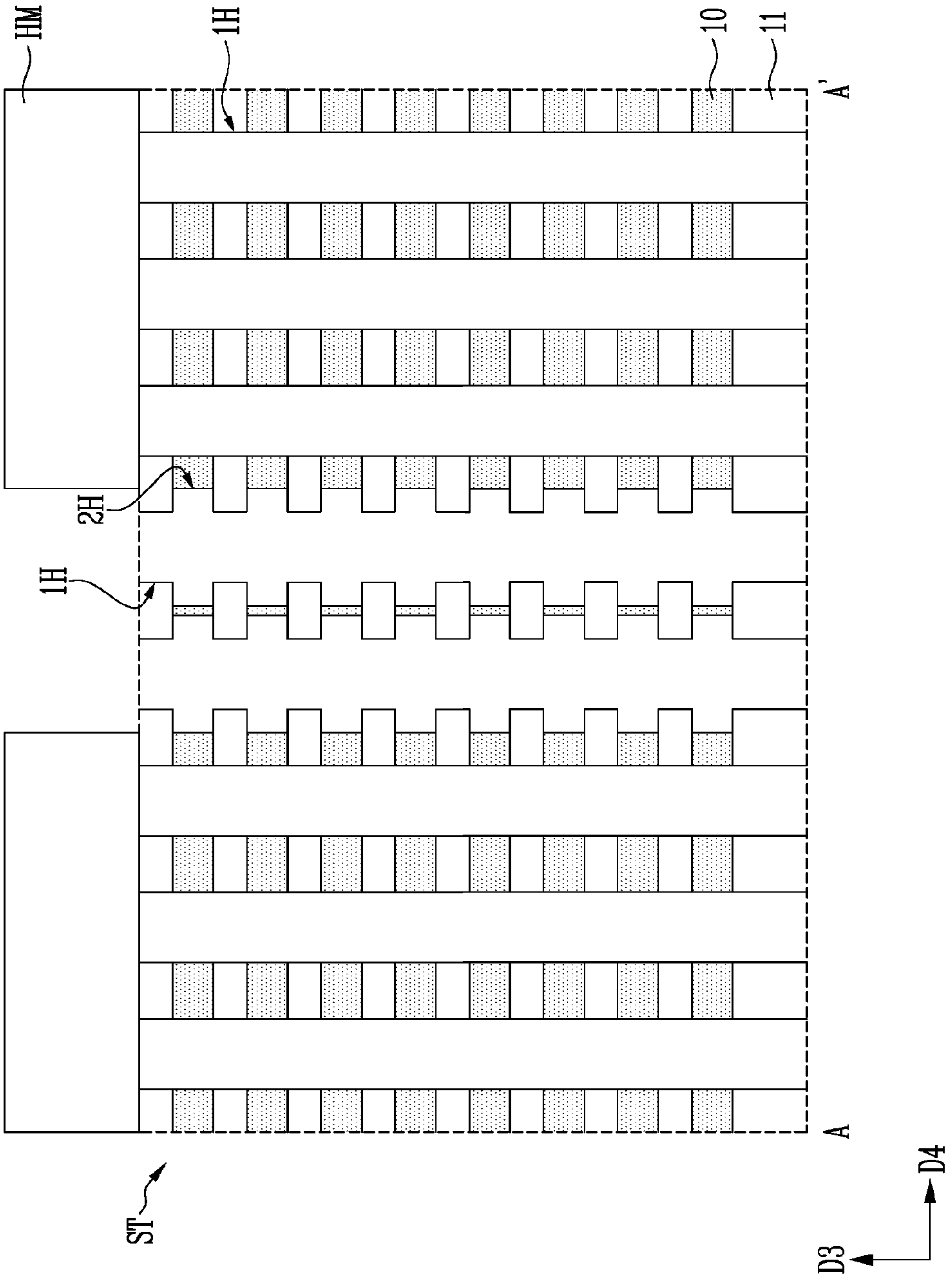

Referring to FIGS. 8C and 9C, a plurality of second holes 2H may be formed by etching portions of the plurality of first material layers 10 through the sidewall of the first group, among the plurality of first holes 1H. The etching amount of the first material layers 10 may be controlled such that individual second holes 2H are coupled to each other in the first direction D1. Here, the plurality of first material layers 10 may remain as separation patterns in the separation area SA. In order to allow the first material layers 10 to remain as the separation patterns, a separation distance between the plurality of first holes 1H may be controlled to be similar to a separation distance between the first channel structures 1CS and the second channel structure 2CS, described above with reference to FIG. 7.

The first material layers 10 remaining as the separation patterns may perform a function of separating conductive layers, as will be described later.

Figure 8D:
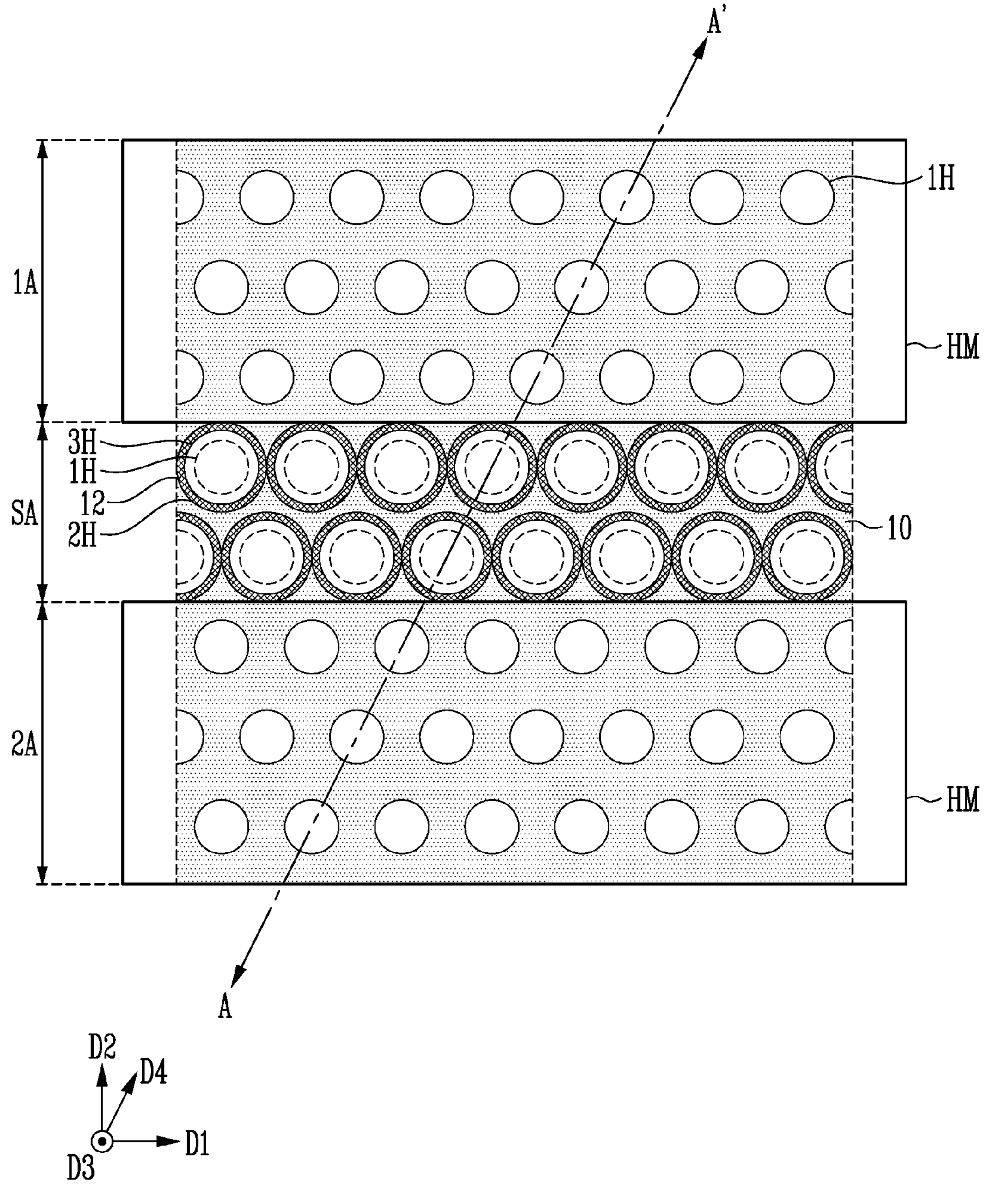
Figure 9D:
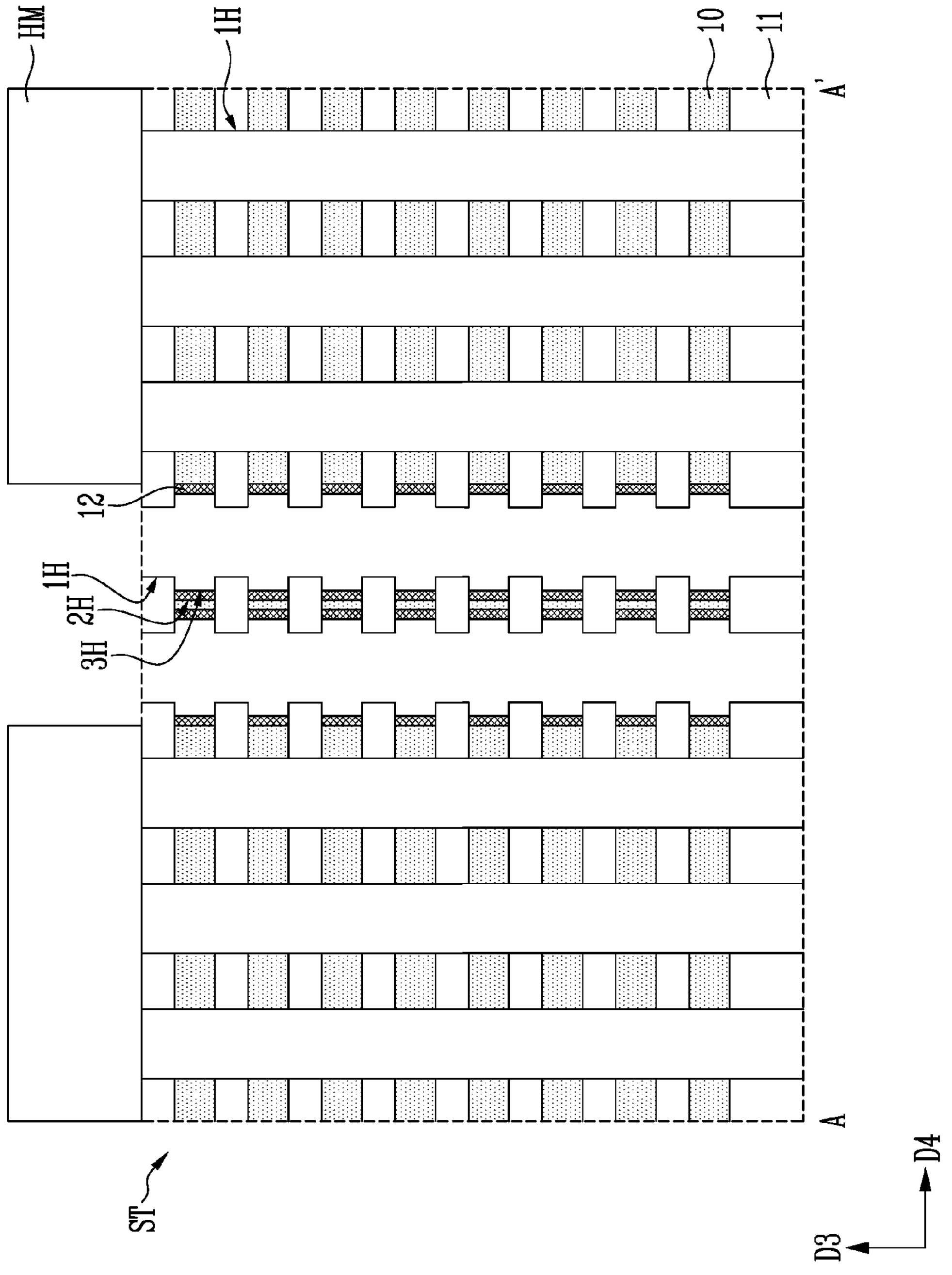

Referring to FIGS. 8D and 9D, a first conductive layer 12 may be formed in each of the second holes 2H. Because the first group, among the plurality of first holes 1H, is opened by the hard mask pattern HM, the first conductive layer 12 may be formed in each of the second holes 2H through the first group, among the first holes 1H. Because the second group, among the plurality of first holes 1H, is blocked by the hard mask pattern HM, a first conductive layer 12 might not be formed in the second group, among the plurality of first holes 1H. The first conductive layer 12 may be formed to extend in the first direction D1. Respective first conductive layers 12 may be formed to be spaced apart from each other with the first material layer 10 of the separation area SA interposed therebetween in the second direction D2. Because the first conductive layers 12 are formed in the plurality of second holes 2H, they may be formed along the profiles of the second holes 2H. In an embodiment, when the plurality of second holes 2H have uneven profiles, the first conductive layers 12 may be formed in an uneven shape.

In an embodiment, the first conductive layers 12 may partially fill the second holes 2H. In an embodiment, the first conductive layers 12 may entirely fill the second holes 2H. When the first conductive layers 12 partially fill the second holes 2H, the second holes 2H might not be filled with the first conductive layers 12, and portions of the second holes 2H may be defined as third holes 3H. Each of the third holes 3H may be used to form a barrier layer or a liner insulating layer, as will be described later with reference to FIGS. 8E and 9E. Respective third holes 3H may be spaced apart from each other in a stacking direction with the corresponding second material layer 11 interposed therebetween.

Figure 8E:
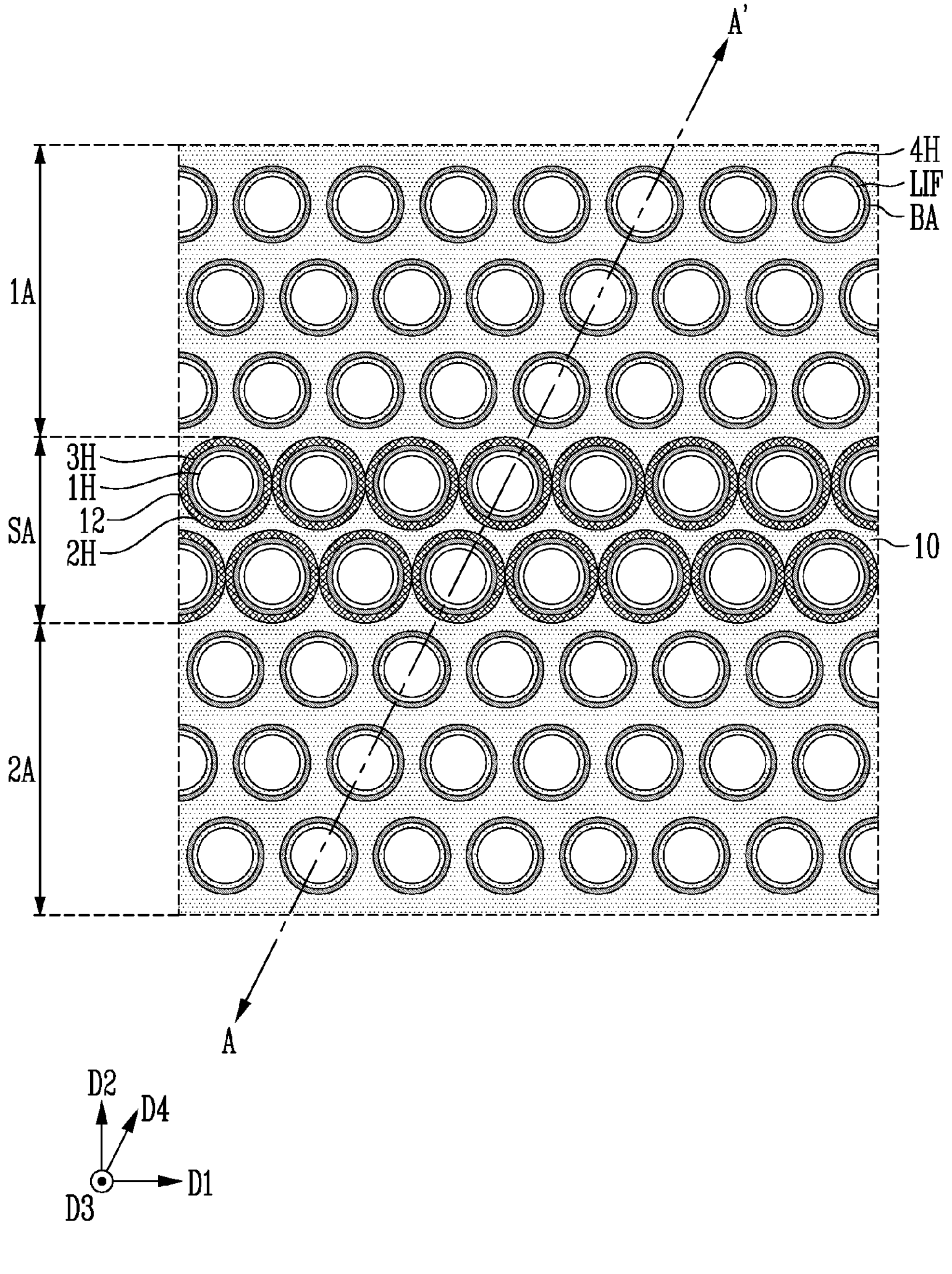
Figure 9E:
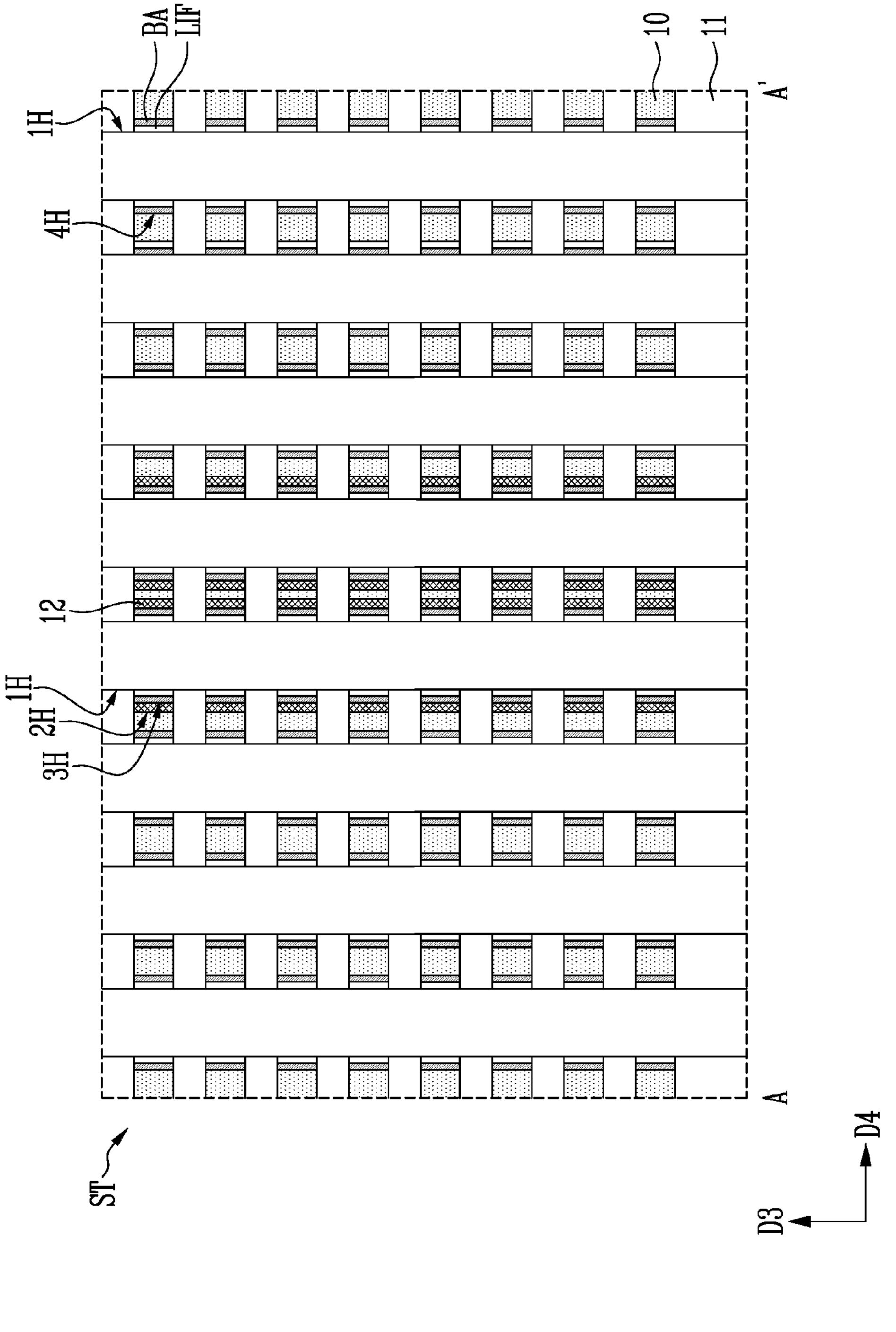

Referring to FIGS. 8E and 9E, the hard mask pattern HM on the stacked body ST may be removed. Thereafter, fourth holes 4H may be formed through the second group, among the plurality of first holes 1H. Because the second group, among the plurality of first holes 1H, is opened by removing the hard mask pattern HM, the fourth holes 4H may be formed by etching portions of the first material layers 10 through the second group, among the plurality of first holes 1H. The fourth holes 4H may be spaced apart from each other in the third direction D3 with the corresponding second material layer 11 interposed therebetween. A barrier layer BA may be formed in each of the third holes 3H and the fourth holes 4H. In detail, the barrier layer BA formed in each third hole 3H may be formed to be coupled to the corresponding first conductive layer 12. The barrier layer BA formed in each fourth hole 4H may be formed to be coupled to the corresponding first material layer 10. A liner insulating layer LIF may be formed in each of the third holes 3H and the fourth holes 4H in which the barrier layer BA is formed. Although the sidewall of the liner insulating layer LIF is illustrated as being formed to overlap the sidewall of the corresponding first hole 1H, the sidewall of the liner insulating layer LIF may be formed not to overlap the sidewall of the corresponding first hole 1H. In an embodiment, the barrier layer BA and the liner insulating layer LIF may be formed to entirely fill each of the third holes 3H and the fourth holes 4H. In an embodiment, the barrier layer BA and the liner insulating layer LIF may be formed to partially fill each of the third holes 3H and the fourth holes 4H.

Figure 8F:
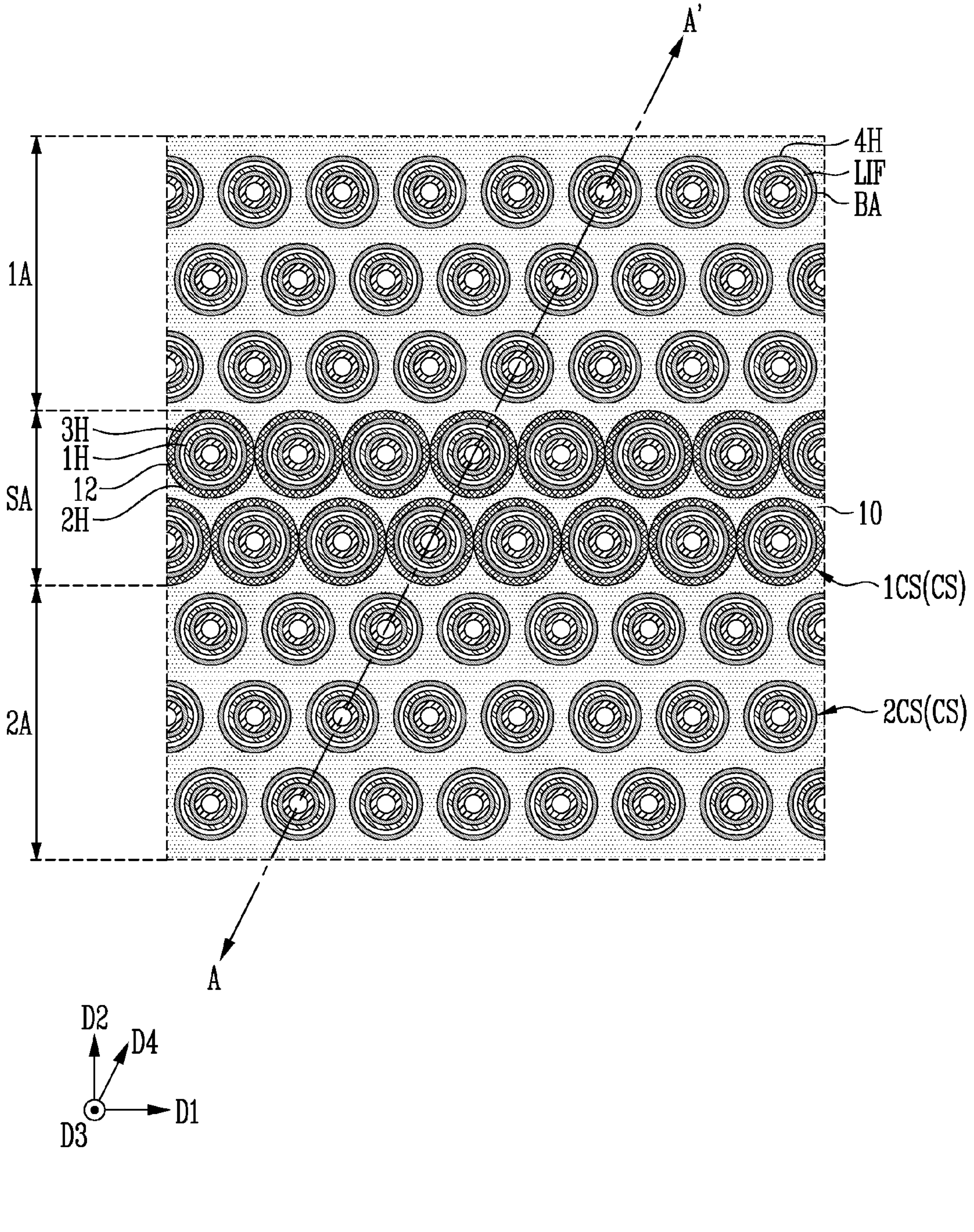
Figure 9F:
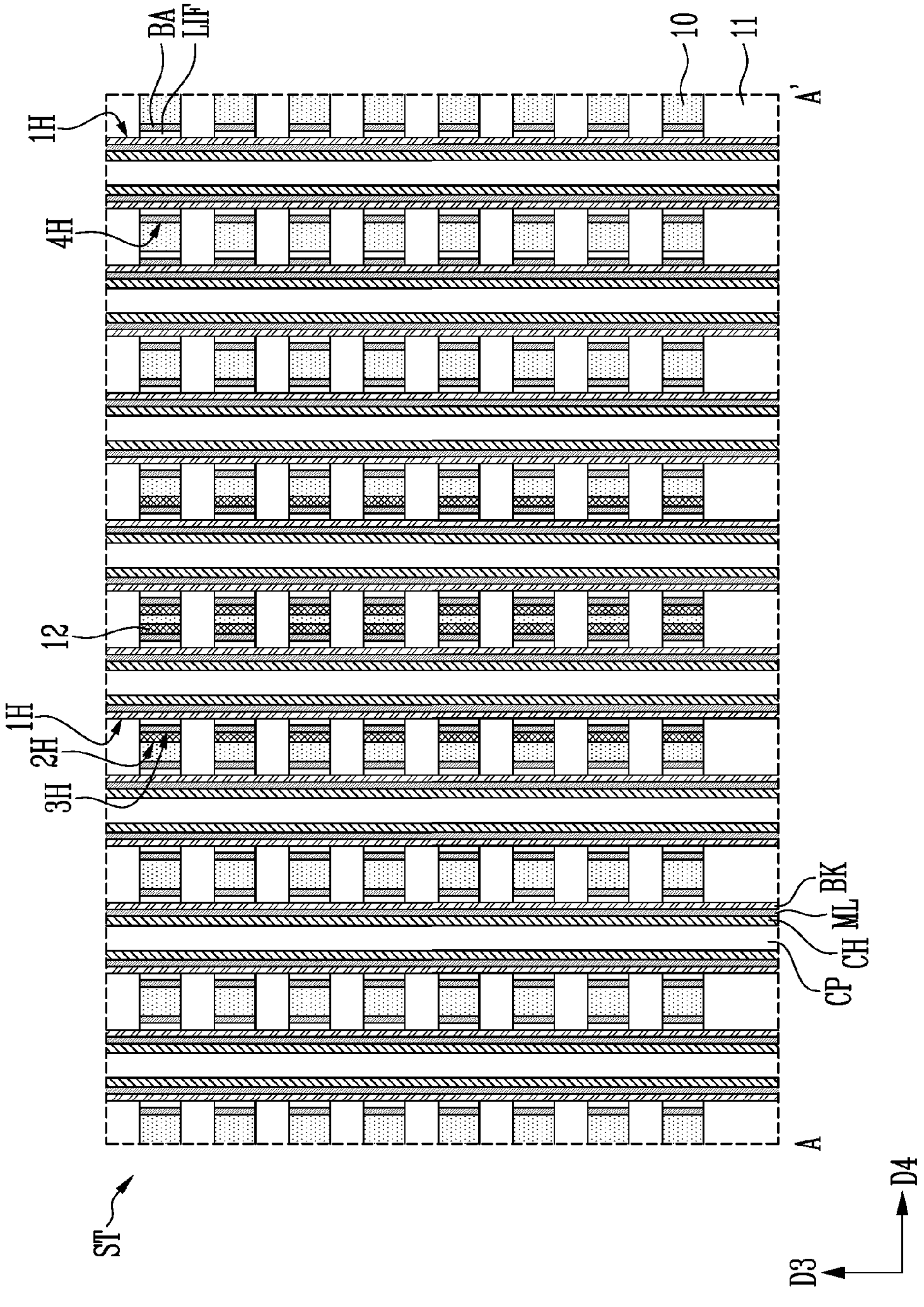

Referring to FIGS. 8F and 9F, a plurality of channel structures CS filling the plurality of first holes 1H in the stacked body ST may be formed. The plurality of channel structures CS may include first channel structures 1CS and second channel structures 2CS. The first channel structures 1CS may be disposed inside the first group arranged in the separation area SA, among the plurality of first holes 1H, and the second channel structures 2CS may be disposed inside the second group arranged in the first area 1A and the second area 2A, among the plurality of first holes 1H. Forming the plurality of channel structures CS may include sequentially forming a blocking layer BK, a memory layer ML, a channel layer CH, and a core pillar CP, along the sidewall of each of the first holes 1H.

Figure 8G:
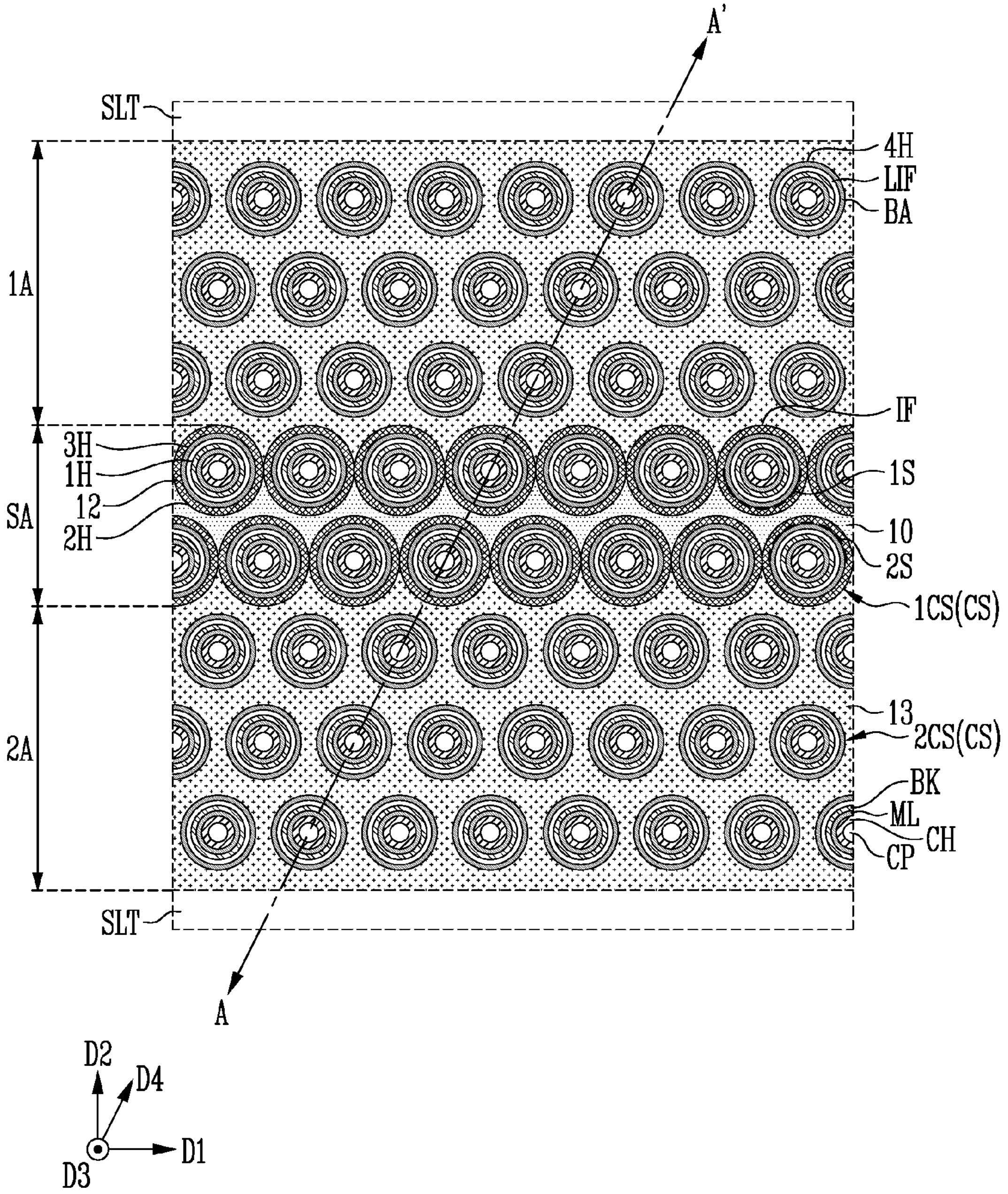
Figure 9G:
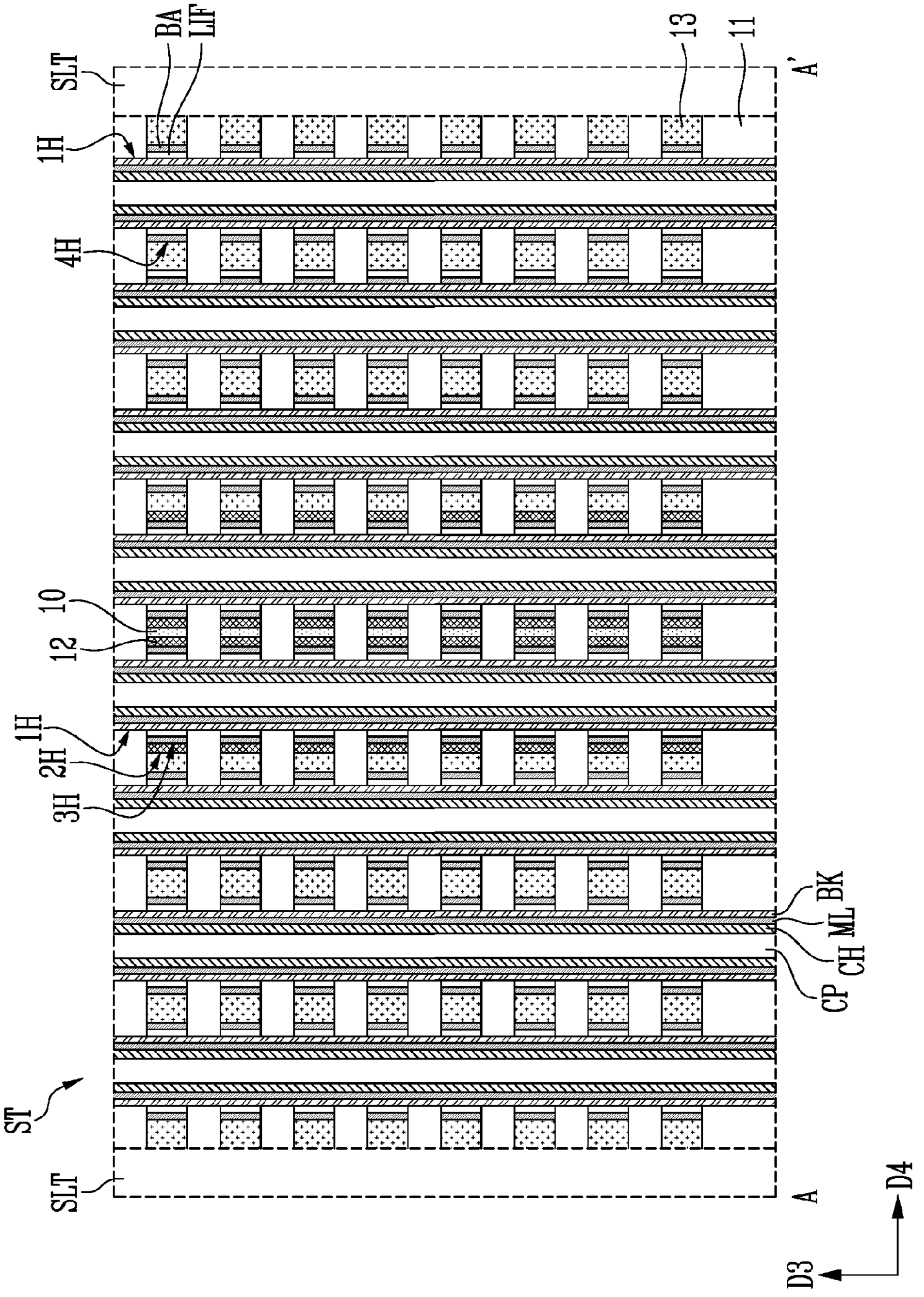

Referring to FIGS. 8G and 9G, slits SLT passing through the stacked body ST may be formed. The slits SLT may be spaced apart from each other with the separation area SA and the first and second areas 1A and 2A of the stacked body ST interposed therebetween. Through the slits SLT, the first material layers 10 of the first and second areas 1A and 2A may be replaced with second conductive layers 13. Here, an etching process may be performed using etchant that enables the second material layers 11 to remain and the first material layers 10 to be selectively removed. Thereafter, the second conductive layers 13 may be injected into the area from which the first material layers 10 are removed, through the slits SLT. Each of the second conductive layers 13 may be formed between the second material layers 11 neighboring each other in the third direction D3. While the first material layers 10 are selectively removed, the first conductive layers 12 may function as etching barriers so that portions of the first material layers 10 disposed in the separation area SA remain as separation patterns.

Figure 10A:
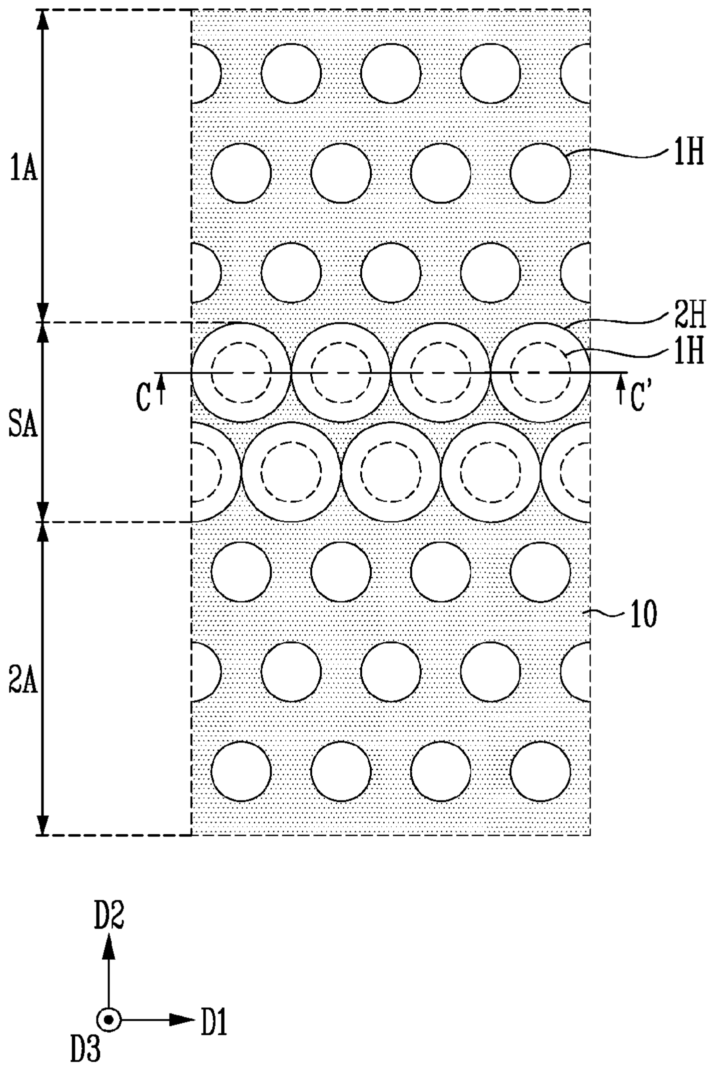
FIGS. 10A and 10B are plan views for explaining a method of manufacturing a memory device according to an embodiment of the present disclosure.
Figure 10B:
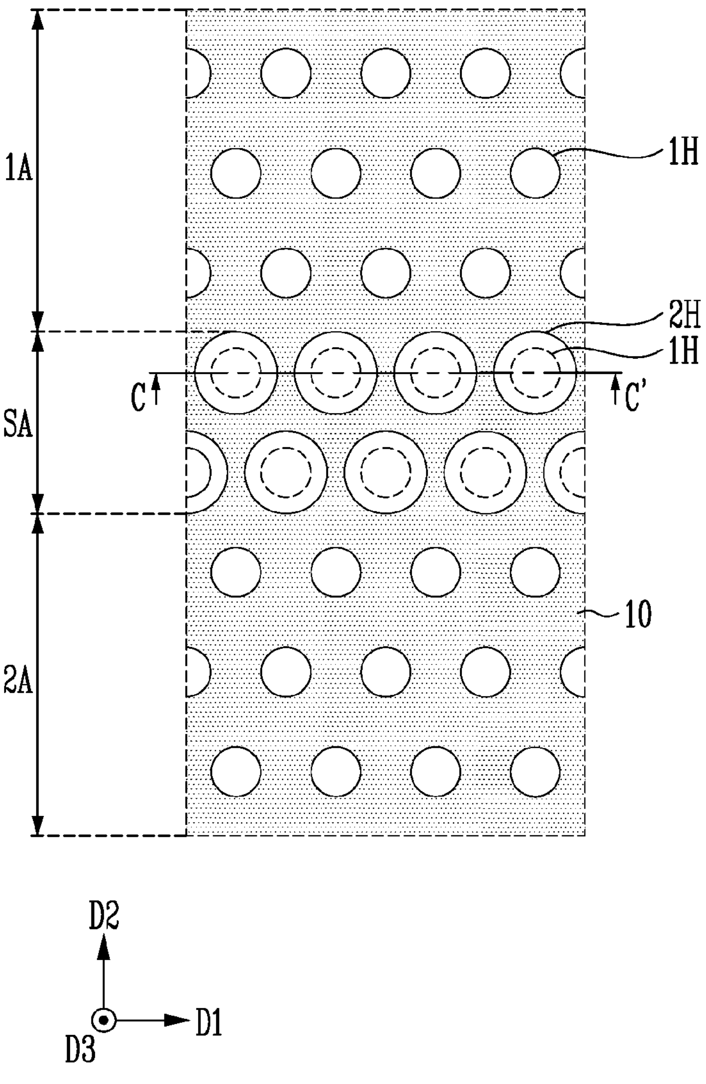

FIGS. 10A and 10B are plan views for explaining a method of manufacturing a memory device according to an embodiment of the present disclosure. FIG. 10A is a plan view of an area in which a select line is formed, and FIG. 10B is a plan view of an area in which a word line is formed.

Figure 11:
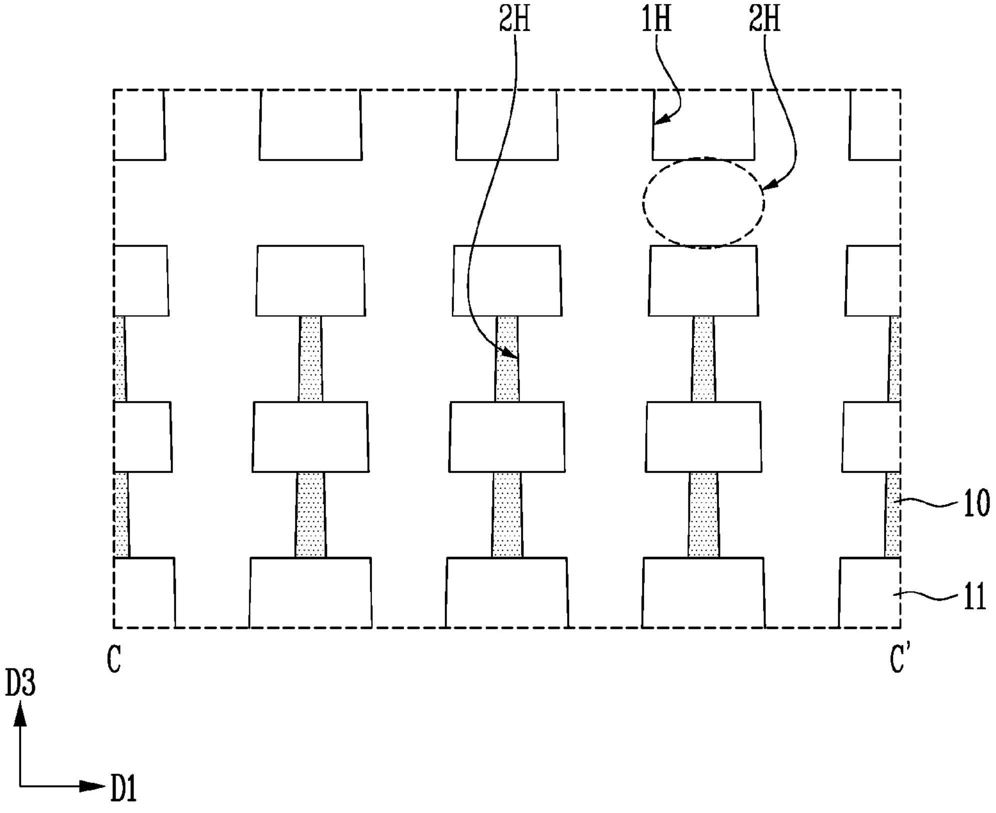
FIG. 11 is a sectional view for explaining a method of manufacturing a memory device according to an embodiment of the present disclosure.

FIG. 11 is a sectional view for explaining a method of manufacturing a memory device according to an embodiment of the present disclosure. FIG. 11 is a sectional view taken along line C-C' of FIGS. 10A and 10B.

Referring to FIGS. 10A, 10B, and 11, as described above with the above-described embodiment, a plurality of first holes 1H may be formed in a stacked body which includes a first area 1A, a second area 2A, and a separation area SA and in which first material layers 10 and second material layers 11 are stacked. In an embodiment, the plurality of first holes 1H may be formed in a shape in which the width thereof is increased in a third direction D3. In this case, the distance between upper portions of the plurality of first holes 1H may be shorter than the distance between lower portions of the plurality of first holes 1H.

Thereafter, as in the case of the above-described embodiment, second holes 2H may be formed through a first group of the plurality of first holes 1H arranged in the separation area SA. In this case, some of the second holes 2H corresponding to the upper portions of the plurality of first holes 1H may be coupled to each other, and others of the second holes 2H corresponding to the lower portions of the first holes 1H may be spaced apart from each other in the first direction D1 with the first material layer 10 interposed therebetween. In an embodiment, second holes 2H in a first group present in an area in which a select line is disposed may be coupled to each other, and second holes 2H in a second group present in an area in which a word line is disposed may be spaced apart from each other by the first material layer 10 in the first direction D1.

Subsequently, as in the case of the above-described embodiment, a process of forming a first conductive layer, a process of forming a barrier layer and a liner insulating layer, a process of forming channel structures, and a process of forming a second conductive layer may be formed. In this way, the drain select line DSL and the word line WL, described above with reference to FIGS. 5A, 5B, and 6 may be provided.

Figure 12:
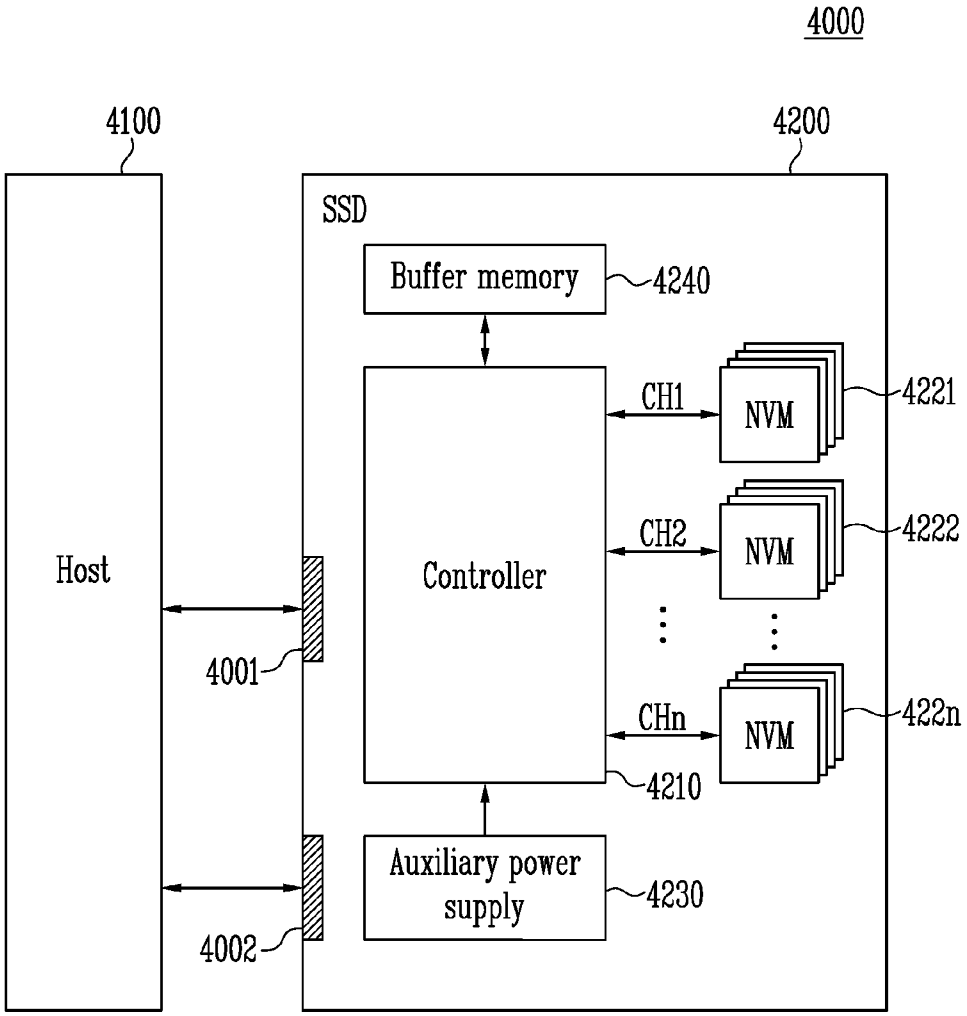
FIG. 12 is a diagram illustrating a solid state drive (SSD) system to which a memory device according to the present disclosure is applied.

FIG. 12 is a diagram illustrating a solid state drive (SSD) system to which a memory device according to the present disclosure is applied.

Referring to FIG. 12, an SSD system 4000 includes a host 4100 and an SSD 4200. The SSD 4200 may exchange a signal with the host 4100 through a signal connector 4001, and may receive power through a power connector 4002. The SSD 4200 may include a controller 4210, a plurality of memory devices 4221 to 422*n*, an auxiliary power supply 4230, and a buffer memory 4240.

The controller 4210 may control the plurality of memory devices 4221 to 422*n* in response to signals received from the host 4100. In an embodiment, the signals may be transmitted based on the interfaces of the host 4100 and the SSD 4200. For example, the signals may be defined by at least one of various interfaces such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer system interface (SCSI), enhanced small disk interface (ESDI), integrated drive electronics (IDE), Firewire, universal flash storage (UFS), WiFi, Bluetooth, and nonvolatile memory express (NVMe).

Each of the plurality of memory devices 4221 to **422*n* may include a plurality of memory cells configured to store data. Each of the memory devices 4221 to 422*n* may be configured in the same manner as the memory device 100 illustrated in FIG. 1. In detail, each of the plurality of memory devices 4221 to 422*n* may include the memory device, described above with reference to FIGS. 4A and 4B, or the memory device, described above with reference to FIGS. 5A, 5B, and 6. The plurality of memory devices 4221 to 422*n* may communicate with the controller 4210 through channels CH1** to CHn.

The auxiliary power supply 4230 may be coupled to the host 4100 through the power connector 4002. The auxiliary power supply 4230 may be supplied with a supply voltage from the host 4100, and may be charged. The auxiliary power supply 4230 may provide the supply voltage of the SSD 4200 when the supply of power from the host 4100 is not smoothly performed. In an embodiment, the auxiliary power supply 4230 may be located inside the SSD 4200 or located outside the SSD 4200. For example, the auxiliary power supply 4230 may be located in a main board, and may provide auxiliary power to the SSD 4200.

The buffer memory 4240 may function as a buffer memory of the SSD 4200. For example, the buffer memory 4240 may store data received from the host 4100 or data received from the plurality of memory devices 4221 to **422*n*, or may store metadata (e.g., mapping tables) of the memory devices 4221 to 422*n*. The buffer memory 4240** may include volatile memories, such as a dynamic random access memory (DRAM), a synchronous DRAM (SDRAM), a double data rate (DDR) SDRAM, and a low power DDR (LPDDR) SDRAM, or nonvolatile memories, such as a ferroelectric RAM (FRAM), a resistive RAM (ReRAM), a spin transfer torque magnetic RAM (STT-MRAM), and a phase-change RAM (PRAM).

Figure 13:
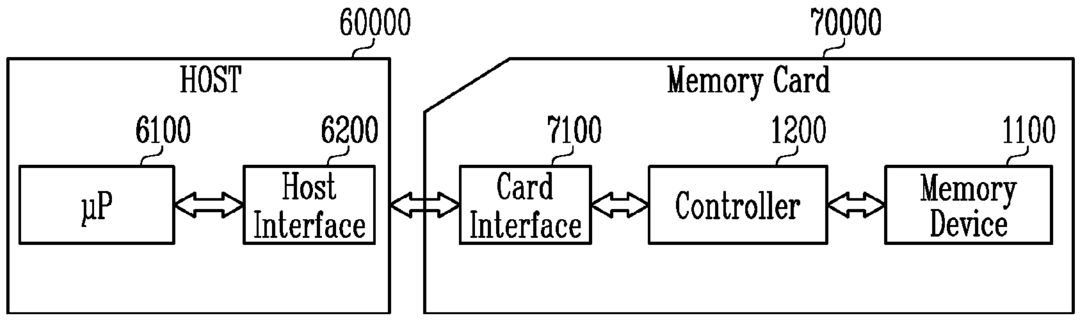
FIG. 13 is a diagram illustrating a memory card system to which a memory device according to an embodiment of the present disclosure is applied.

FIG. 13 is a diagram illustrating a memory card system to which a memory device according to an embodiment of the present disclosure is applied.

Referring to FIG. 13, a memory system 70000 may be implemented as a memory card or a smart card. The memory system 70000 may include a memory device 1100, a controller 1200, and a card interface 7100.

The controller 1200 may control data exchange between the memory device 1100 and the card interface 7100. In an embodiment, the card interface 7100 may be, but is not limited to, a secure digital (SD) card interface or a multi-media card (MMC) interface.

The card interface 7100 may interface data exchange between a host 60000 and the controller 1200 according to the protocol of the host 60000. In an embodiment, the card interface 7100 may support a universal serial bus (USB) protocol and an interchip (IC)-USB protocol. Here, the card interface 7100 may refer to hardware capable of supporting a protocol which is used by the host 60000, software installed in the hardware, or a signal transmission method.

When the memory system 70000 is coupled to a host interface 6200 of the host 60000 such as a PC, a tablet PC, a digital camera, a digital audio player, a mobile phone, console video game hardware, or a digital set-top box, the host interface 6200 may perform data communication with the memory device 1100 through the card interface 7100 and the controller 1200 under the control of a microprocessor (μP) 6100.

According to an embodiment of the present disclosure, the degree of integration of a memory device may be increased.

What is claimed is:

1. A memory device comprising:

a first conductive layer extending in a first direction;

a second conductive layer extending from the first conductive layer in a second direction intersecting the first direction;

a plurality of first channel structures penetrating the first conductive layer and disposed spaced apart in the first direction;

a plurality of second channel structures penetrating the second conductive layer; and a separation pattern spaced apart from the second conductive layer by the first conductive layer;

wherein the separation pattern includes a protrusion extending toward the plurality of second channel structures;

wherein the first conductive layer forms an interface with the second conductive layer; and wherein the interface is disposed between the plurality of first channel structures and the plurality of second channel structures.

2. The memory device according to claim 1, wherein the interface is formed along profiles of the plurality of first channel structures facing the second conductive layer.

3. The memory device according to claim 1, wherein the interface includes an uneven shape.

4. The memory device according to claim 1, wherein the interface includes an arc shape.

5. The memory device according to claim 1, wherein the separation pattern is formed along profiles of the plurality of first channel structures facing the separation pattern.

6. The memory device according to claim 1, wherein the protrusion of the separation pattern is disposed between the plurality of first channel structures.

7. The memory device according to claim 1, wherein the separation pattern includes a nitride.

8. The memory device according to claim 1, wherein:

the plurality of first channel structures include first channel structures neighboring each other in the first direction;

the neighboring first channel structures are spaced apart by a first distance;

the plurality of second channel structures are spaced apart from the plurality of first channel structures by at least a second distance; and the first distance is shorter than the second distance.

9. A memory device comprising:

a select line including a first select conductive layer extending in a first direction and a second select conductive layer extending from the first select conductive layer in a second direction intersecting the first direction;

a word line including a plurality of first cell conductive layers and a second cell conductive layer, wherein the plurality of first cell conductive layers are disposed spaced apart from each other in the first direction to overlap the first select conductive layer, and the second cell conductive layer is configured to fill spaces between the plurality of first cell conductive layers and extend from the plurality of first cell conductive layers in the second direction;

an insulating layer disposed between the word line and the select line;

a plurality of first channel structures individually penetrating the plurality of first cell conductive layers and extending to penetrate the insulating layer and the first select conductive layer; and a plurality of second channel structures penetrating the second cell conductive layer and extending to penetrate the insulating layer and the second select conductive layer.

10. The memory device according to claim 9, further comprising a separation pattern extending along side portions of the word line and the select line.

11. The memory device according to claim 10, wherein the separation pattern comprises:

a first separation pattern formed at a level identical to that of the select line; and a second separation pattern formed at a level identical to that of the word line, wherein the first separation pattern is formed to have an area smaller than that of the second separation pattern.

12. The memory device according to 10, where the separation pattern is formed along profiles of the plurality of first channel structures.

13. The memory device according to claim 10, wherein the separation pattern includes a protrusion between the plurality of first channel structures.

14. The memory device according to claim 10, wherein the separation pattern includes a nitride.

15. The memory device according to claim 9, further comprising a barrier layer configured to enclose each of the plurality of first channel structures and the plurality of second channel structures.

16. The memory device according to claim 9, further comprising a liner insulating layer configured to enclose each of the plurality of first channel structures and the plurality of second channel structures.

* * * * *